(12) United States Patent
Kim et al.

(10) Patent No.: US 11,094,645 B2
(45) Date of Patent: Aug. 17, 2021

(54) SEMICONDUCTOR DEVICE AND METHOD OF MANUFACTURING A SEMICONDUCTOR DEVICE

(71) Applicant: Amkor Technology Singapore Holding Pte. Ltd., Valley Point (SG)

(72) Inventors: Hee Sung Kim, Suncheon-si (KR); Yeong Beom Ko, Incheon (KR); Joon Dong Kim, Gwangju (KR); Dong Jean Kim, Gwangju (KR); Sang Seon Oh, Gwang-ju (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 16/534,814

(22) Filed: Aug. 7, 2019

(65) Prior Publication Data
US 2019/0371739 A1    Dec. 5, 2019

Related U.S. Application Data

(63) Continuation of application No. 16/197,328, filed on Nov. 20, 2018, now Pat. No. 10,381,313, which is a
(Continued)

(51) Int. Cl.
*H01L 23/552* (2006.01)
*H01L 23/538* (2006.01)
(Continued)

(52) U.S. Cl.
CPC ........ *H01L 23/552* (2013.01); *H01L 21/4853* (2013.01); *H01L 21/561* (2013.01);
(Continued)

(58) Field of Classification Search
CPC . H01L 21/4853; H01L 21/561; H01L 21/565; H01L 21/6835; H01L 21/6836;
(Continued)

(56) References Cited

U.S. PATENT DOCUMENTS 7,799,602 B2 * 9/2010 Pagaila ............... H01L 21/56
                                              438/106
8,043,892 B2 * 10/2011 Kwak ................. H01L 24/97
                                              438/107
(Continued)

FOREIGN PATENT DOCUMENTS

CN      102270588      12/2011
CN      102306645      1/2012
(Continued)

OTHER PUBLICATIONS

Office Action for Chinese Patent Application No. 201811535247.8, dated Dec. 11, 2019, 27 pages, including English Translation.
(Continued)

*Primary Examiner* — Luan C Thai
(74) *Attorney, Agent, or Firm* — McAndrews, Held & Malloy, Ltd.

(57) ABSTRACT

An exemplary semiconductor device can comprise a die, a redistribution structure (RDS), an interconnect, a conductive strap, an encapsulant, and an EMI shield. The redistribution structure can comprise an RDS top surface coupled to the die bottom side. The interconnect can be coupled to the RDS bottom surface. The conductive strap can be coupled to the RDS, and can comprise a strap inner end coupled to the RDS bottom surface, and a strap outer end located lower than the RDS bottom surface. The encapsulant can encapsulate the conductive strap and the RDS bottom surface. The EMI shield can cover and contact the encapsulant sidewall and the strap outer end. Other examples and related methods are also disclosed herein.

20 Claims, 23 Drawing Sheets

Related U.S. Application Data continuation of application No. 15/841,892, filed on Dec. 14, 2017, now Pat. No. 10,134,687.

(51) Int. Cl.

| | | |
|---|---|---|
| *H01L 23/31* | (2006.01) | |
| *H01L 21/48* | (2006.01) | |
| *H01L 21/78* | (2006.01) | |
| *H01L 23/00* | (2006.01) | |
| *H01L 21/56* | (2006.01) | |
| *H01L 21/683* | (2006.01) | |

(52) U.S. Cl.
CPC ........ *H01L 21/565* (2013.01); *H01L 21/6835* (2013.01); *H01L 21/6836* (2013.01); *H01L 21/78* (2013.01); *H01L 23/3114* (2013.01); *H01L 23/5386* (2013.01); *H01L 23/5389* (2013.01); *H01L 24/19* (2013.01); *H01L 24/20* (2013.01); *H01L 24/73* (2013.01); *H01L 24/13* (2013.01); *H01L 2224/13111* (2013.01); *H01L 2224/214* (2013.01); *H01L 2924/1304* (2013.01); *H01L 2924/3025* (2013.01); *H01L 2924/3511* (2013.01)

(58) Field of Classification Search
CPC ... H01L 21/78; H01L 23/552; H01L 23/3114; H01L 23/5386; H01L 23/5389; H01L 24/19; H01L 24/20; H01L 24/73
USPC ........................................................ 257/659
See application file for complete search history.

(56) References Cited

U.S. PATENT DOCUMENTS

| | | | |
|---|---|---|---|
| 8,766,429 B2 | 7/2014 | Kim | |
| 9,570,406 B2 | 2/2017 | Dang | |
| 9,627,228 B1 | 4/2017 | Chen | |
| 9,653,407 B2 | 5/2017 | Chen | |
| 9,793,222 B1* | 10/2017 | Lee | H01L 21/6835 |
| 9,831,170 B2 | 11/2017 | Scanlan | |
| 9,859,229 B2 | 1/2018 | Tsai | |
| 2014/0145315 A1 | 5/2014 | Lim | |
| 2017/0141081 A1 | 5/2017 | Lee et al. | |
| 2017/0221859 A1* | 8/2017 | Chen | H01L 23/552 |
| 2017/0358540 A1* | 12/2017 | Min | H01L 23/295 |
| 2018/0151478 A1* | 5/2018 | Chen | H01L 24/73 |

FOREIGN PATENT DOCUMENTS

| | | |
|---|---|---|
| CN | 102760667 A | 10/2012 |
| CN | 106711125 A | 5/2017 |
| CN | 107342279 A | 11/2017 |

OTHER PUBLICATIONS

Second Office Action for Chinese Patent Application No. 201811535247.8, dated May 11, 2020, 28 pages, including English Translation.
Decision of Rejection for Chinese Patent Application No. 201811535247.8, dated Aug. 4, 2020, 29 pages, including English Translation.

* cited by examiner

SEMICONDUCTOR DEVICE AND METHOD OF MANUFACTURING A SEMICONDUCTOR DEVICE

CROSS-REFERENCE TO RELATED APPLICATIONS/INCORPORATION BY REFERENCE

This application is a continuation of U.S. patent application Ser. No. 16/197,328, filed Nov. 20, 2018, and titled "SEMICONDUCTOR DEVICE AND METHOD OF MANUFACTURING A SEMICONDUCTOR DEVICE," now U.S. Pat. No. 10,381,313; which is a continuation of U.S. patent application Ser. No. 15/841,892, filed Dec. 14, 2017, and titled "SEMICONDUCTOR DEVICE AND METHOD OF MANUFACTURING A SEMICONDUCTOR DEVICE," now U.S. Pat. No. 10,134,687; the entire contents of each of which are hereby incorporated herein by reference.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
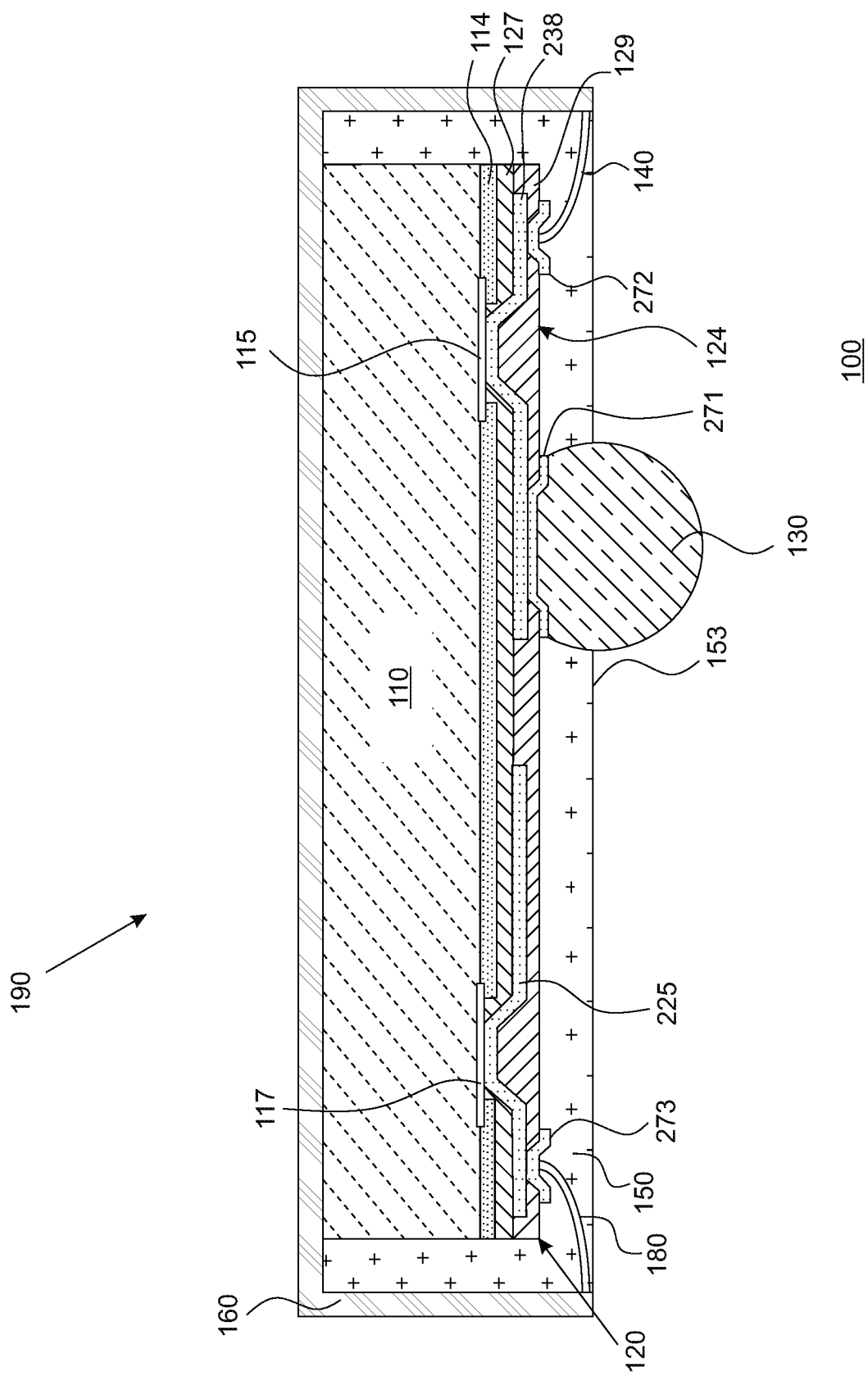
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The terms "and/or" include any single item, or any combination of the items, in the list joined by "and/or". As used in this disclosure, the singular forms are intended to include the plural forms as well, unless the context clearly indicates otherwise.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device can comprise a semiconductor die, a redistribution structure, an interconnect, a conductive strap, an encapsulant, and an EMI shield. The semiconductor die can comprise a die top side, a die sidewall, and a die bottom side. The redistribution structure can comprise an RDS top surface coupled to the die bottom side, an RDS sidewall, and an RDS bottom surface. The interconnect can be coupled to the RDS bottom surface. The conductive strap can be coupled to the RDS, and can comprise a strap inner end coupled to the RDS bottom surface, and a strap outer end located lower than the RDS bottom surface. The encapsulant can encapsulate the conductive strap and the RDS bottom surface, and can comprise an encapsulant interior surface, an encapsulant sidewall, and an encapsulant bottom surface. The EMI shield can cover and contacts the encapsulant sidewall and the strap outer end.

In one example, a method for manufacturing a semiconductor device can comprise providing an electronic structure. The electronic structure can comprise a first semiconductor die having a first die top side, a first die sidewall, and, a first die bottom side. The electronic structure can also comprise a first redistribution structure (RDS) having a first RDS top surface coupled to the first die bottom side, a first RDS sidewall; and a first RDS bottom surface. The method can also comprise coupling a conductive strap to the first RDS, where the conductive strap can comprise a first strap section having a first strap inner end coupled to the first RDS bottom surface, and a first strap outer end located lower than the first RDS bottom surface. The method can further comprise encapsulating with an encapsulant the conductive strap and the first RDS, and applying an EMI shield that covers and conforms to a first encapsulant sidewall of the encapsulant and to the first strap outer end.

In one example, a semiconductor device can comprise a semiconductor die, a redistribution (RDS) structure, an interconnect, a wire, an encapsulant, and an EMI shield. The semiconductor die can comprise a die top side, a die sidewall, and a die bottom side comprising a die pad. The redistribution structure can comprise an RDS top surface defined by a buildup dielectric layer directly on the die top side, an RDS sidewall coplanar with the die sidewall, an RDS bottom surface, and a redistribution path. The redistribution path can comprise a conductive layer that is on the buildup dielectric layer and that is coupled to the die pad through an opening of the buildup dielectric layer, where the redistribution path can extend laterally and vertically to the RDS bottom surface. The interconnect can be coupled to the redistribution path at RDS bottom surface. The wire can be coupled to the RDS and can comprise a wire inner end wirebonded to the RDS bottom surface, and a wire outer end located lower than the RDS bottom surface. The encapsulant can comprise a mold compound layer that encapsulates the wire, the die sidewall, the RDS sidewall, and the RDS bottom surface. The encapsulant can comprise an encapsulant interior surface coupled to the RDS bottom surface, the RDS sidewall, and the die sidewall, an encapsulant sidewall, and an encapsulant bottom surface. The EMI shield can fully cover the encapsulant sidewall, the encapsulant top surface, and the wire outer end.

Other examples are included in the present disclosure. Such examples may be found in the figures, in the claims, and/or in the description of the present disclosure.

FIG. 1 shows a cross-sectional view of an example semiconductor device 100. In the example shown in FIG. 1, semiconductor device 100 can comprise an electronic device 110, a redistribution structure (RDS) 120, an electrical interconnect 130, a protective material 150, and conductive materials 140, 180, and 160.

Electronic device 110 can comprise terminals 115 and 117. In addition, electronic device 110 can comprise a non-conductive material 114. Redistribution structure 120 can comprise non-conductive materials 127 and 129 and conductive materials 225 and 238. Conductive materials 271, 272, and 273 can be formed at the bottom surface of redistribution structure 120. In some examples, conductive materials 140 and/or 180 can be referred as conductive straps or strap sections.

Redistribution structure 120, electrical interconnect 130, protective material 150, and conductive materials 140, 180, 160, 271, 272, and 273 can be referred to as a semiconductor package 190 and package 190 can provide protection for electronic device 110 from external elements and/or environmental exposure. In addition, semiconductor package 190 can provide electrical coupling between external electrical components (not shown) and terminals 115 and 117.

Figure 2A:
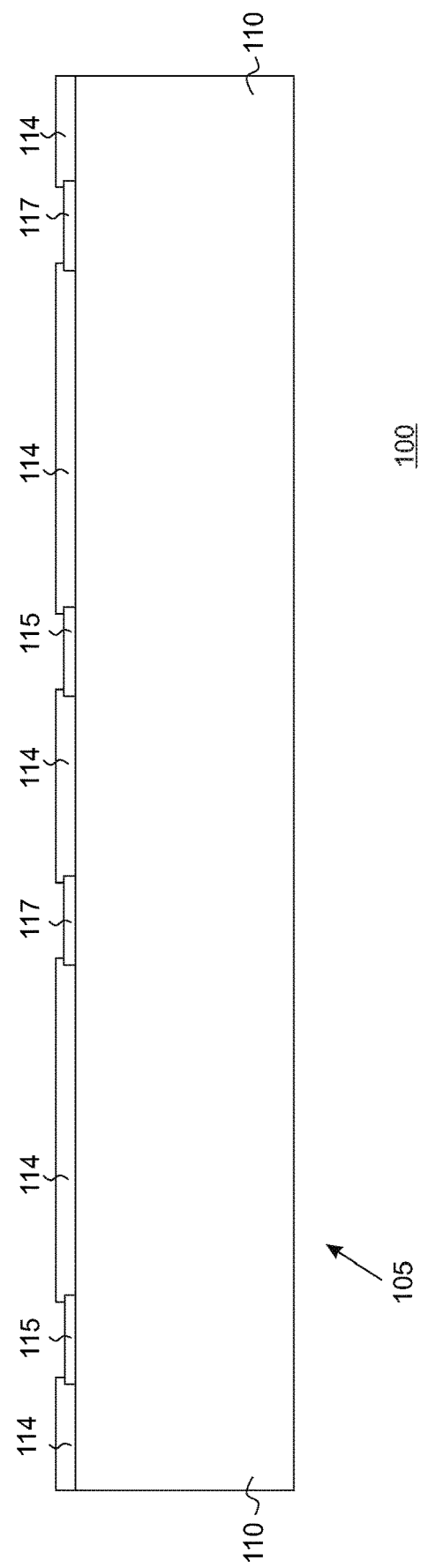
FIGS. 2A to 2T show cross-sectional views of an example method for manufacturing an example semiconductor device.
Figure 2B:
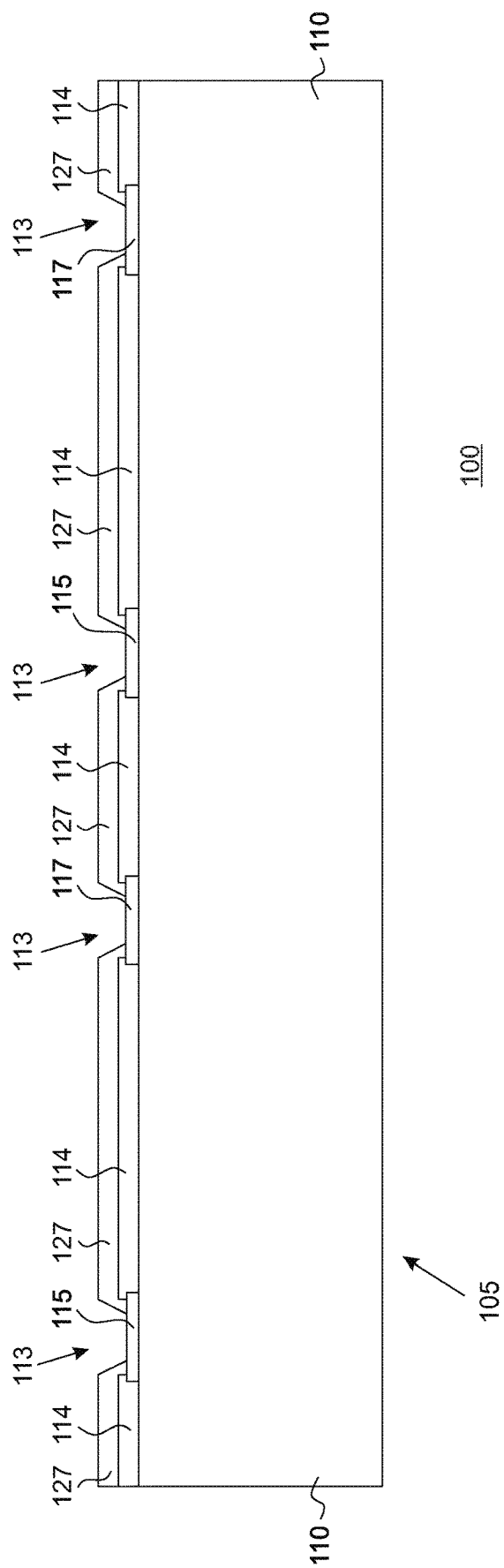
Figure 2C:
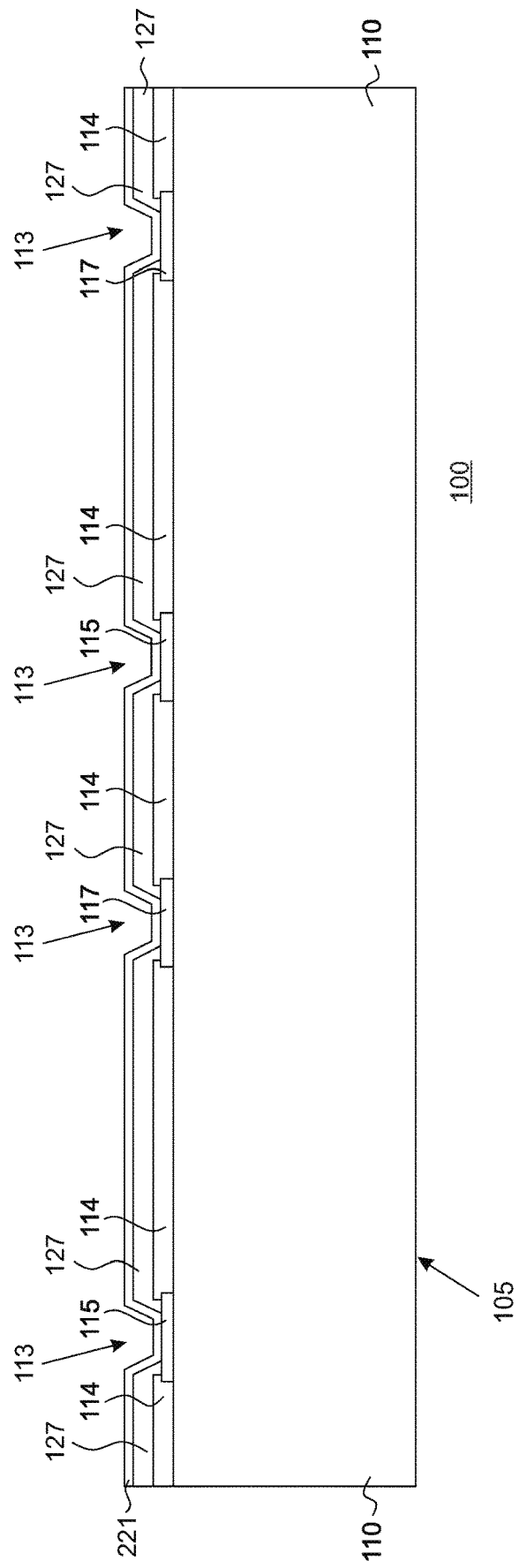
Figure 2D:
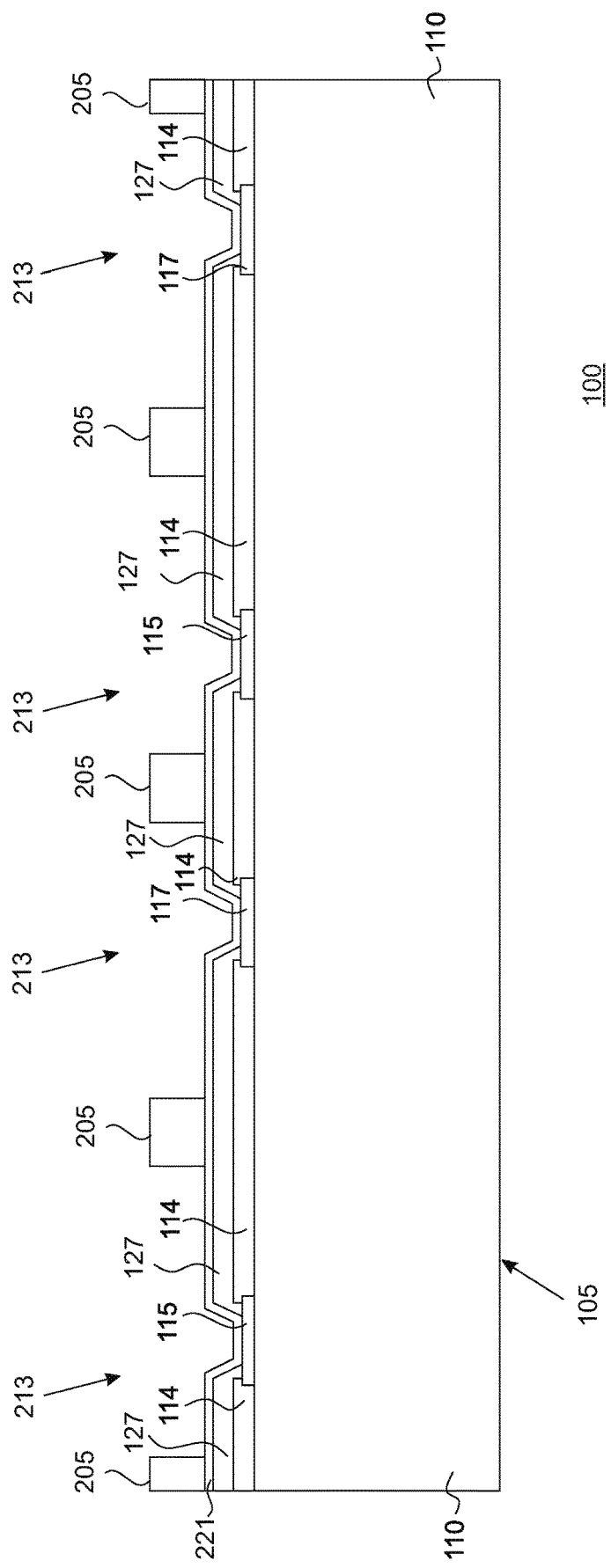
Figure 2E:
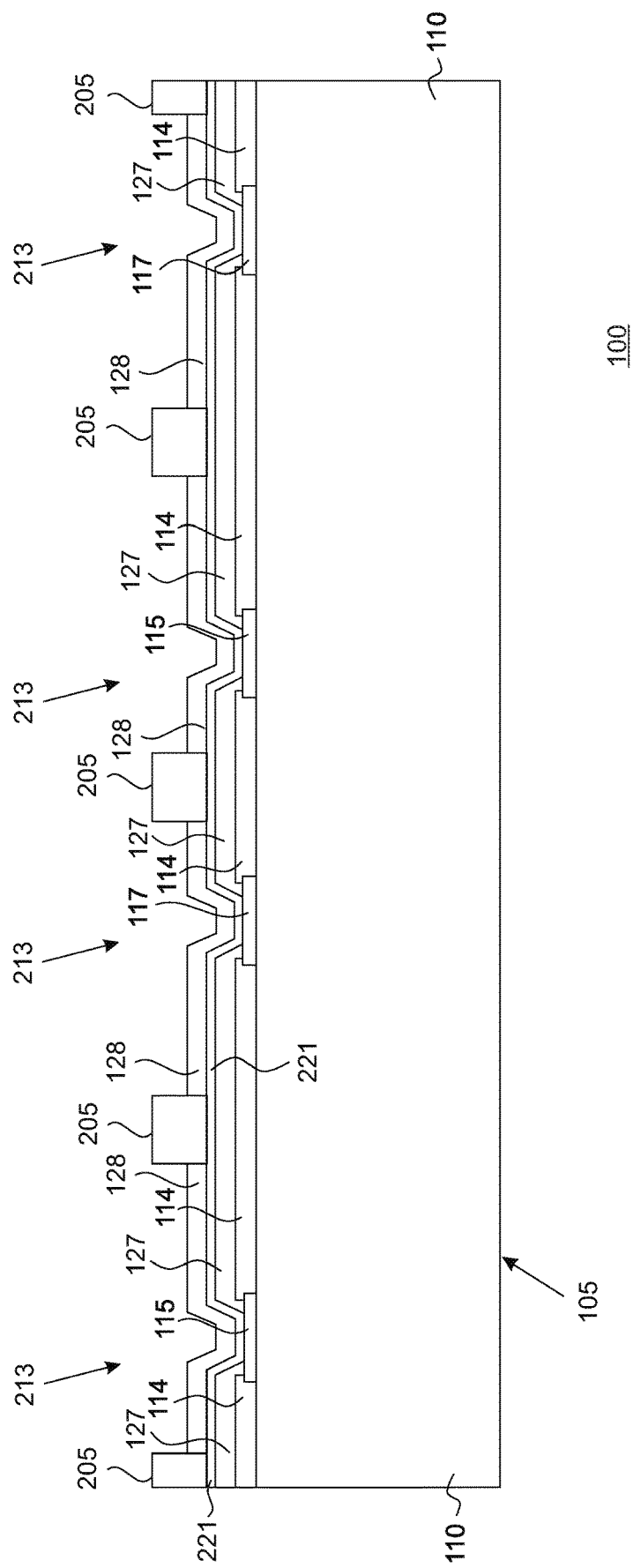
Figure 2F:
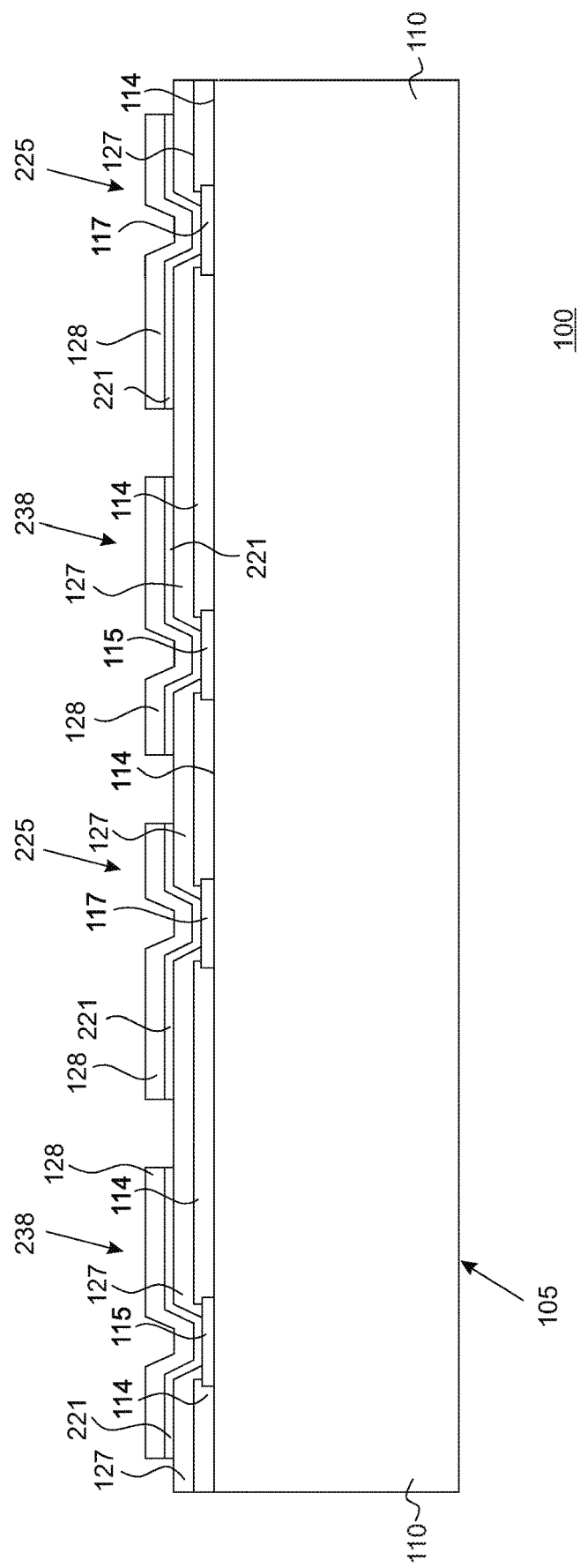
Figure 2G:
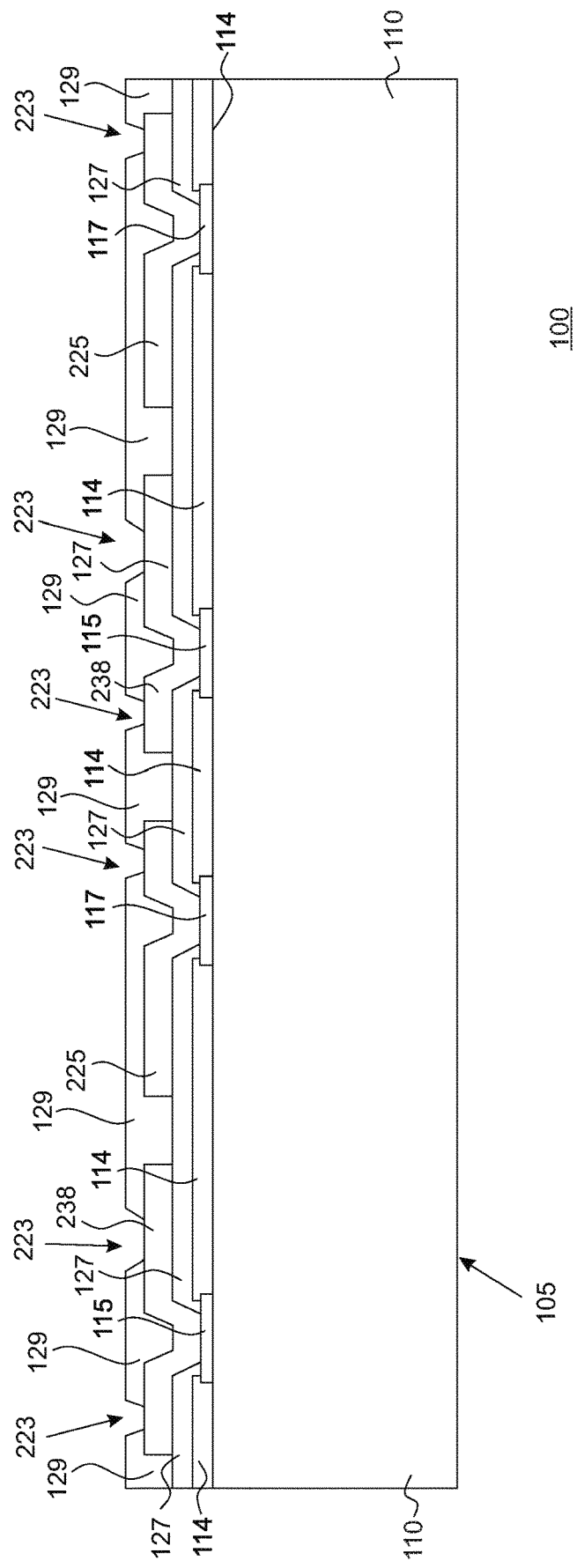
Figure 2H:
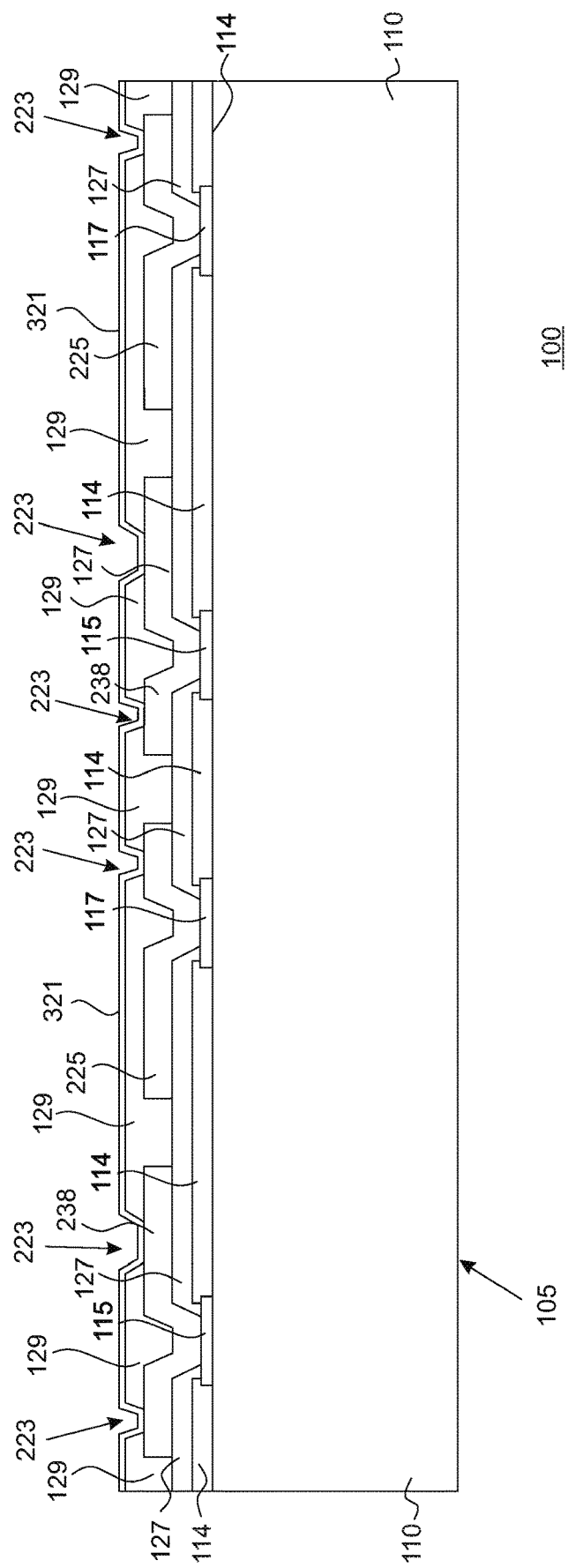
Figure 2I:
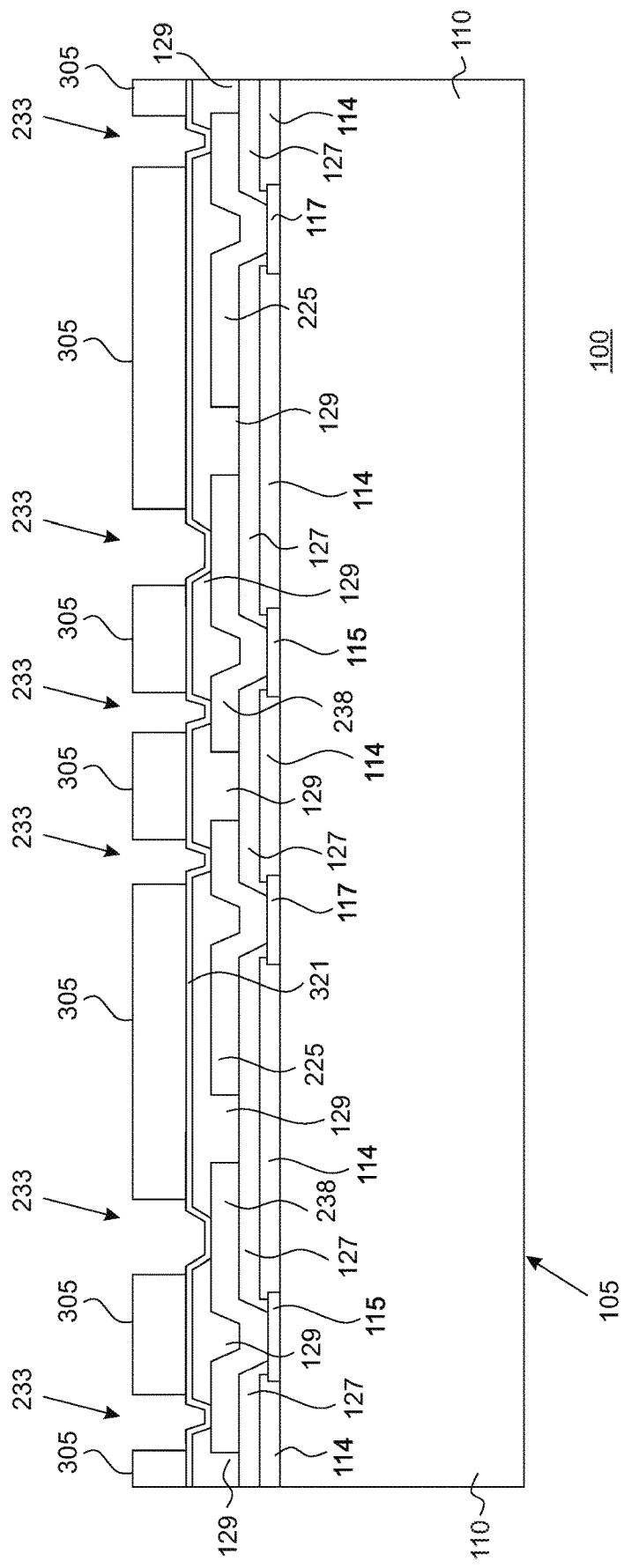
Figure 2J:
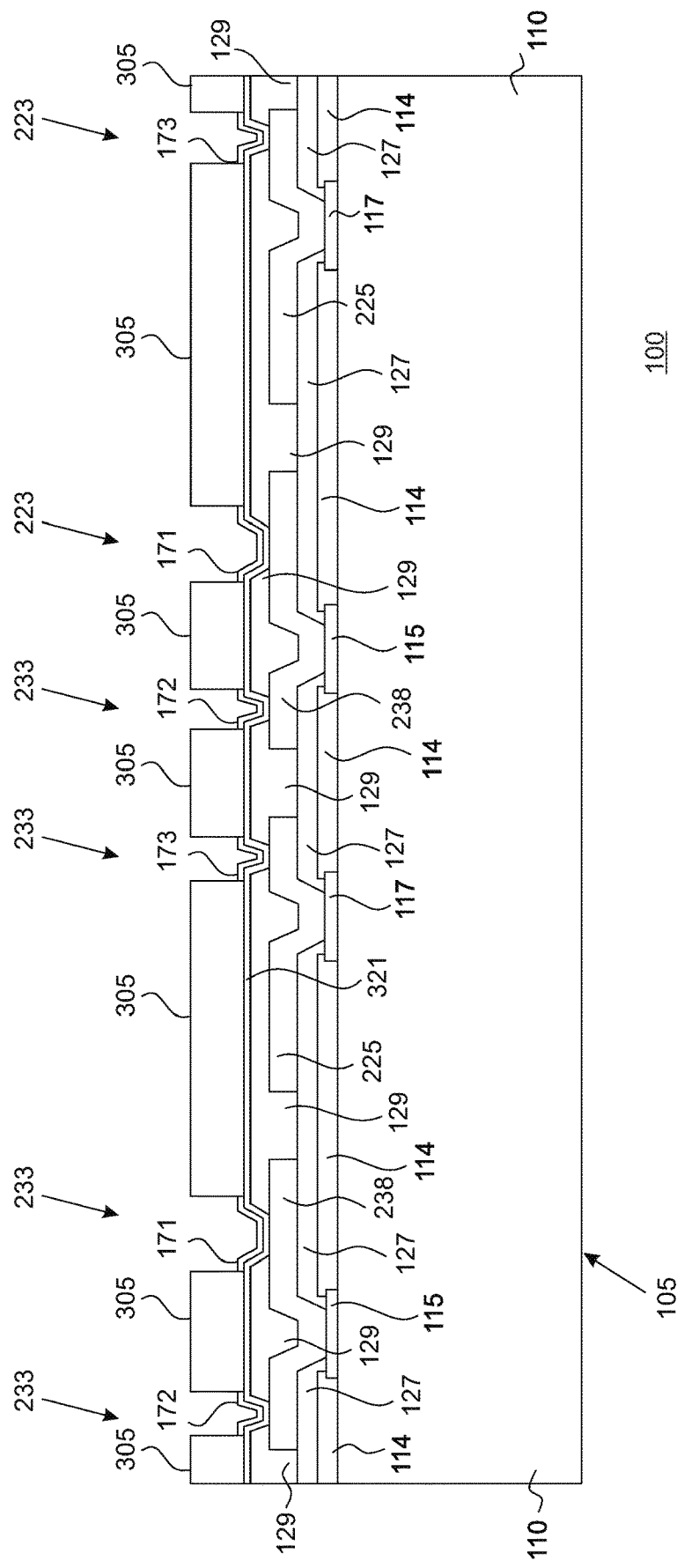
Figure 2K:
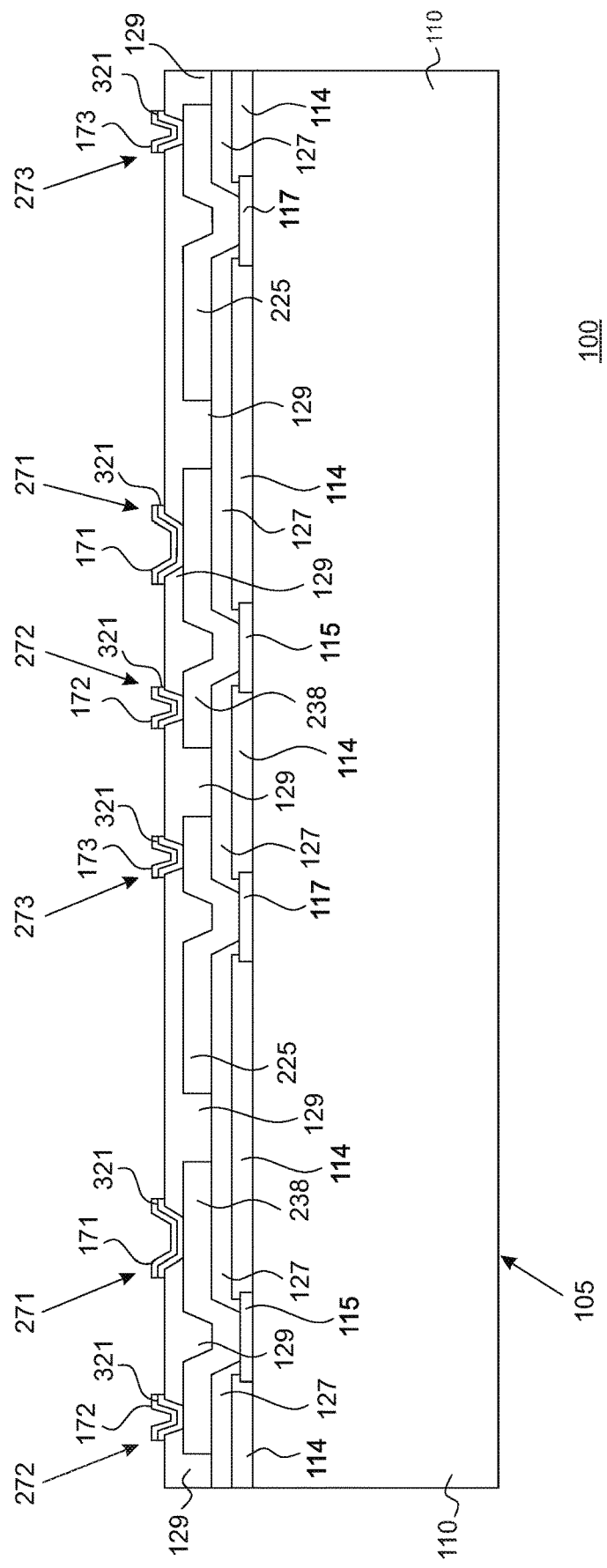
Figure 2L:
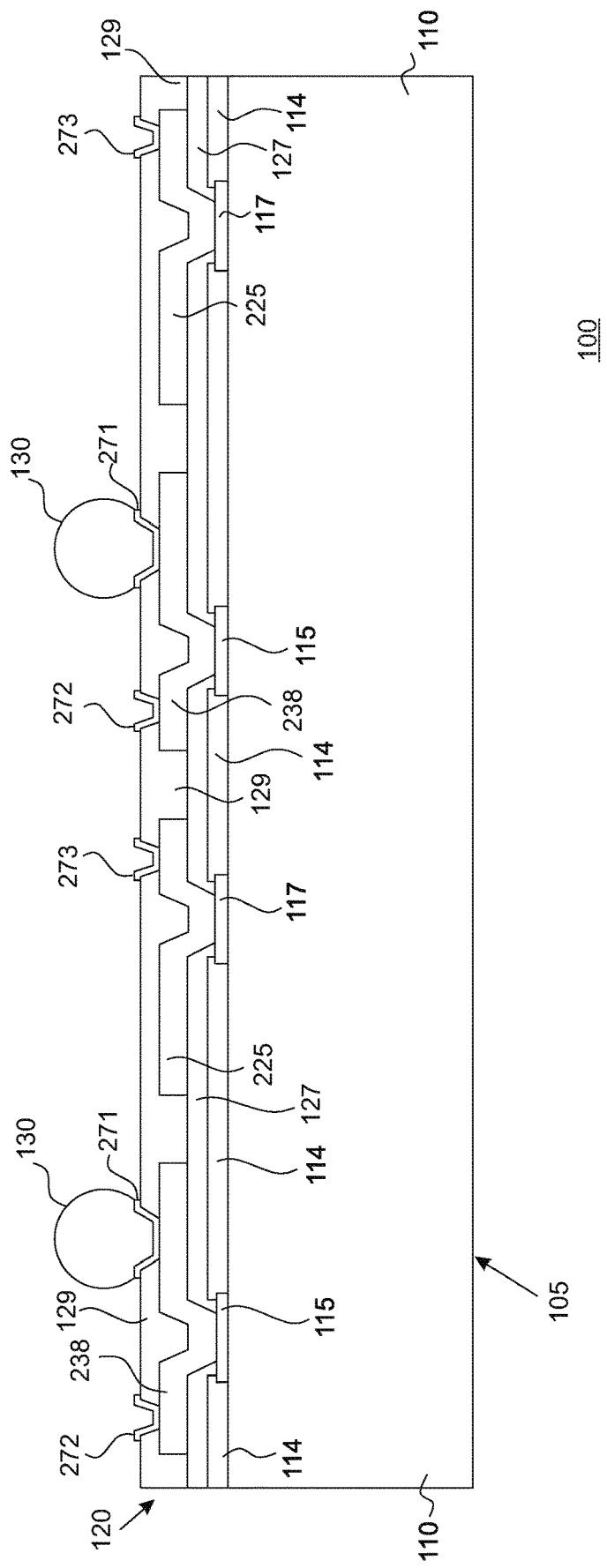
Figure 2M:
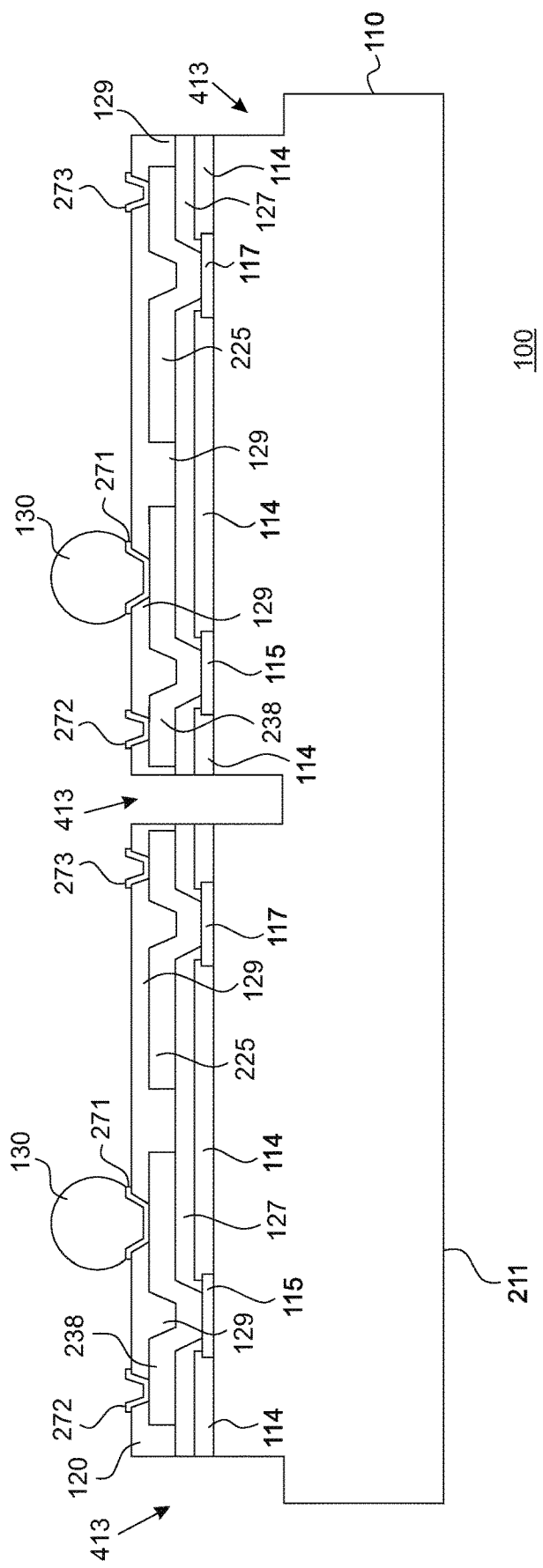
Figure 2N:
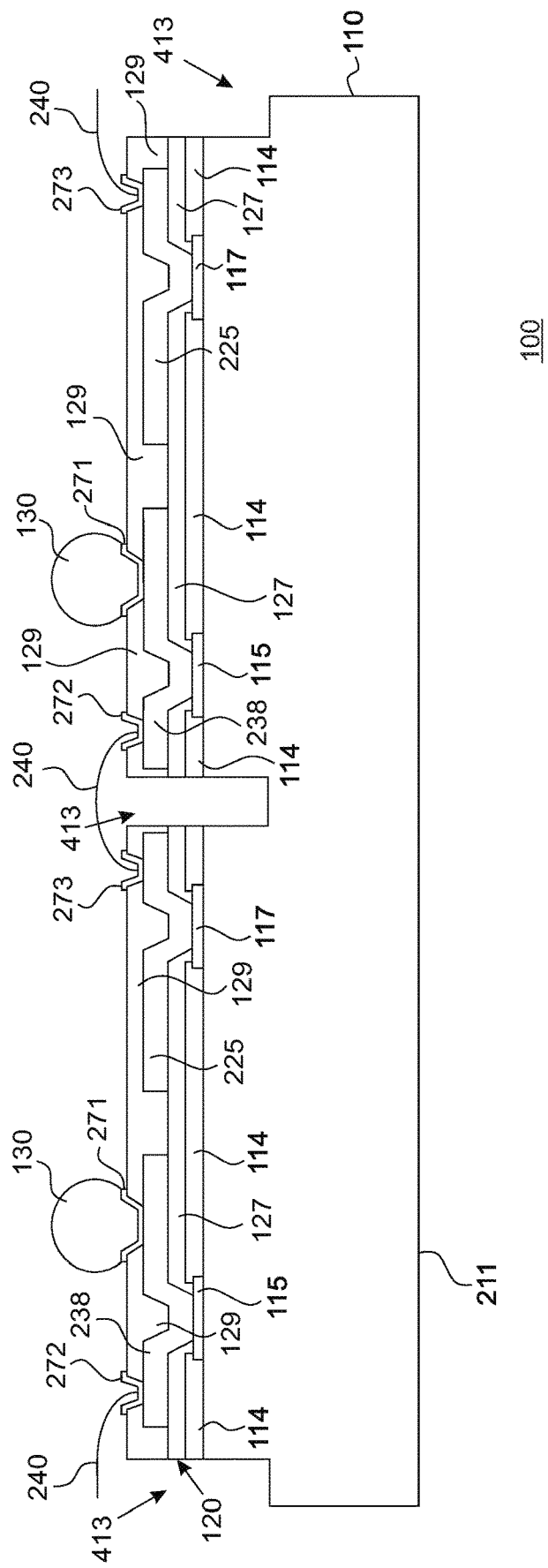
Figure 2O:
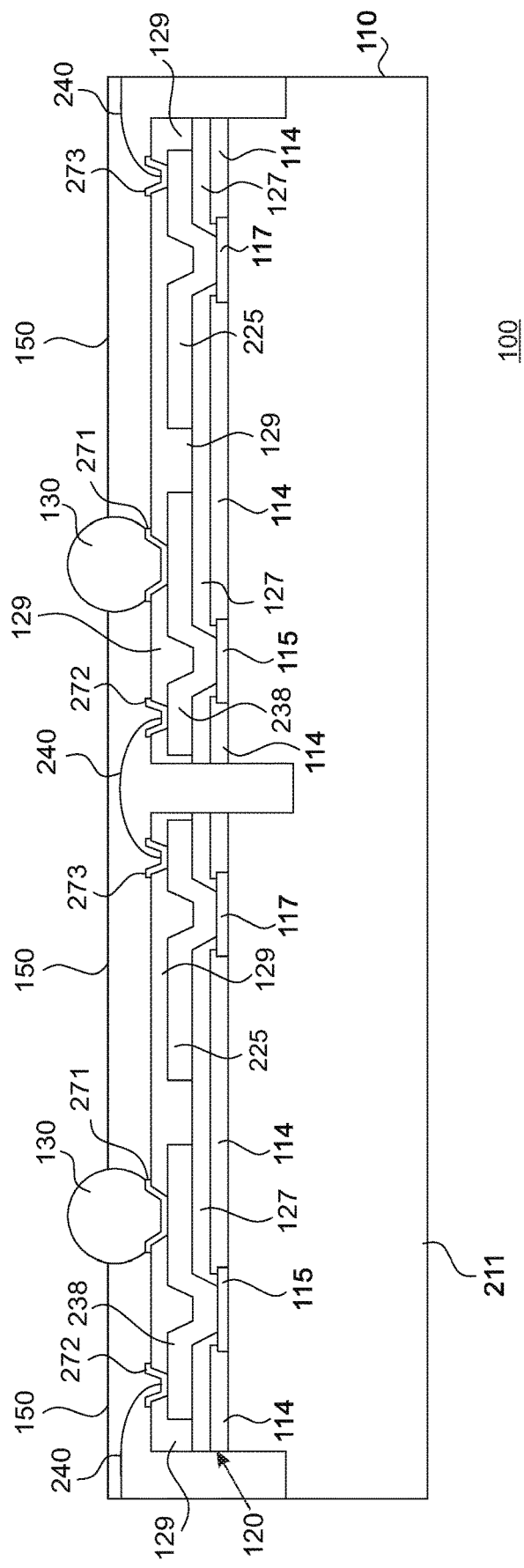
Figure 2P:
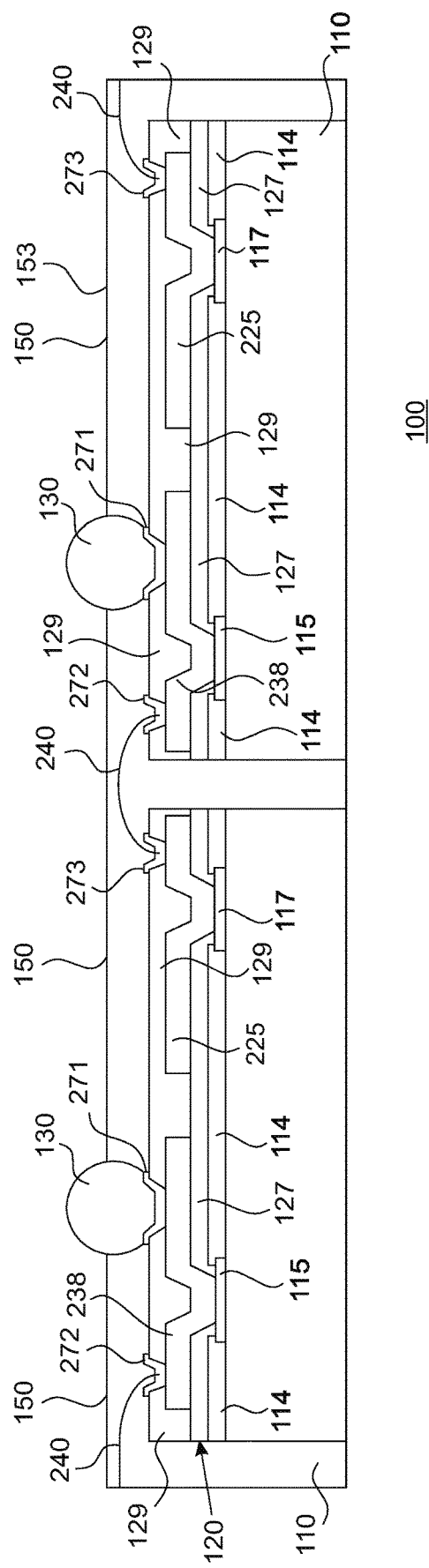
Figure 2Q:
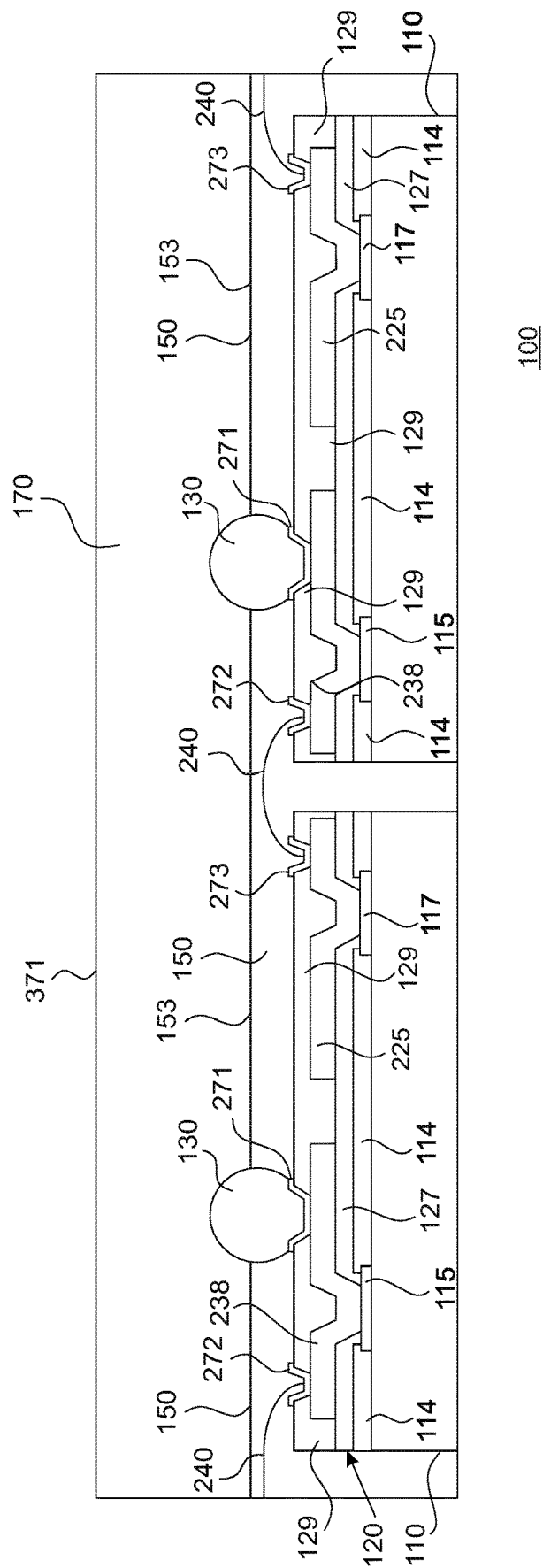
Figure 2R:
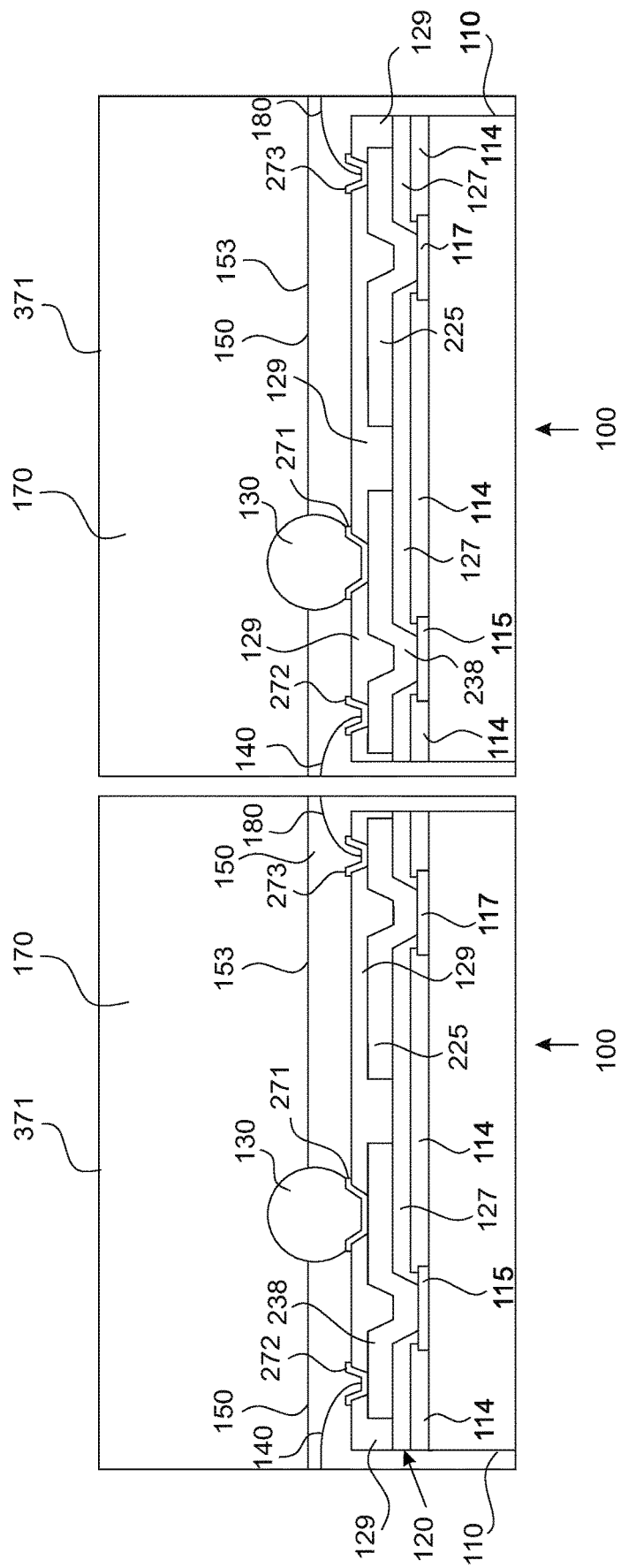
Figure 2S:
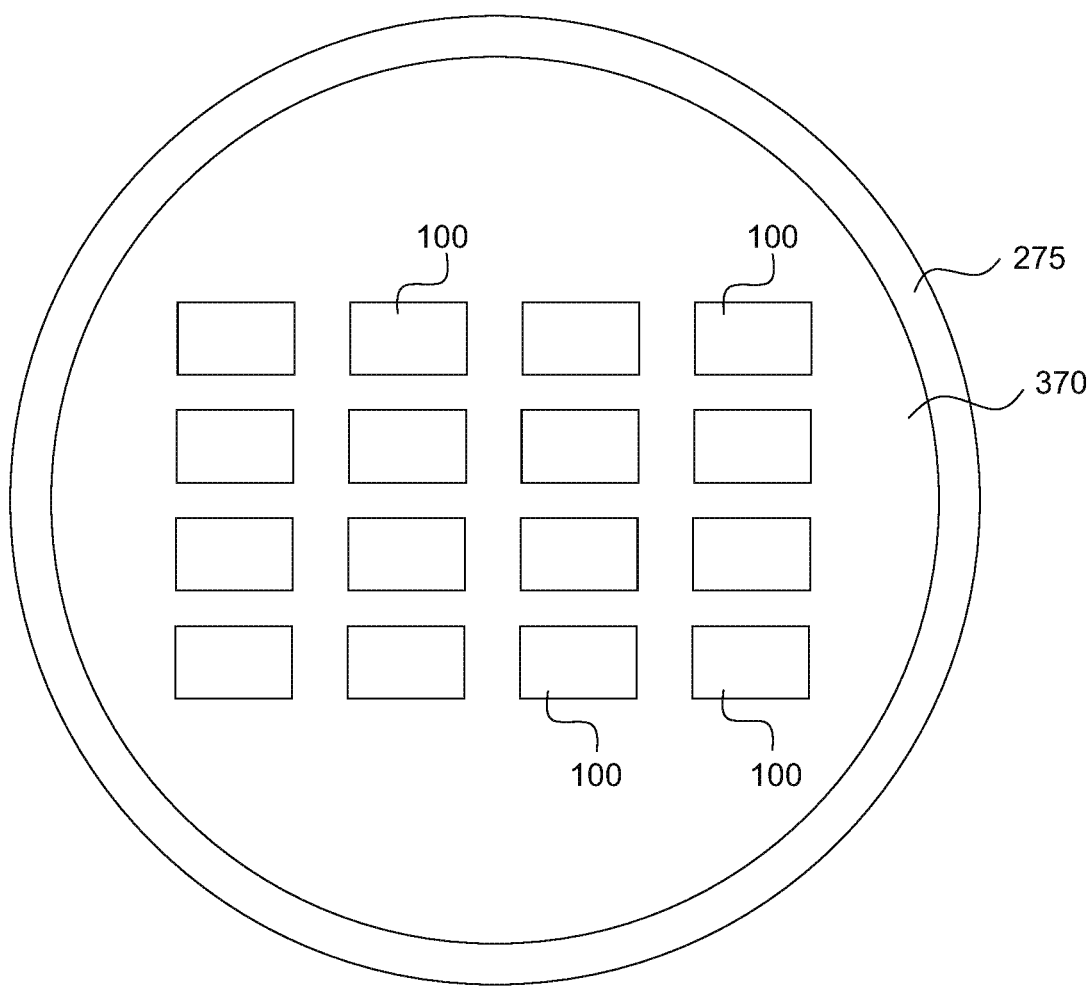
Figure 2T:
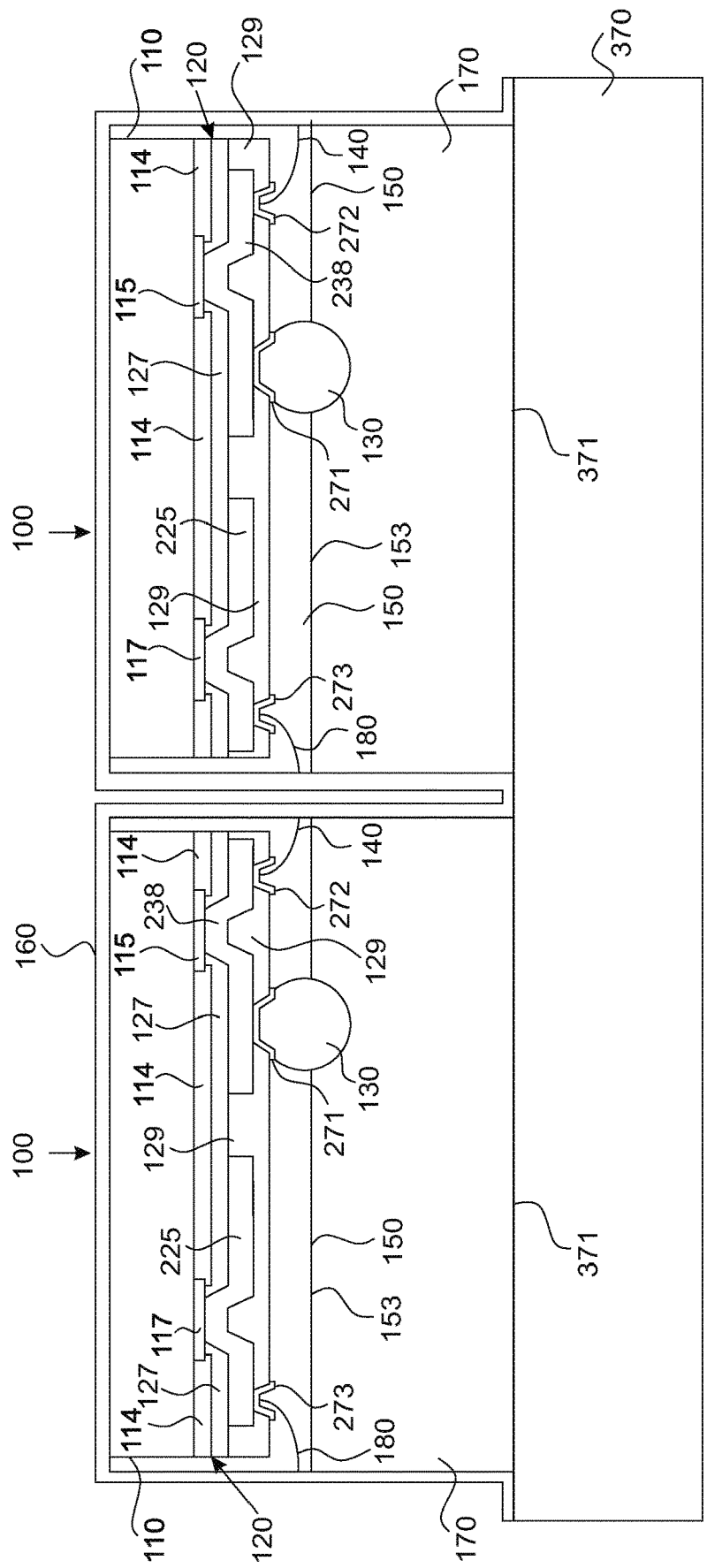

FIGS. 2A to 2T show cross-sectional views of an example method for manufacturing semiconductor device 100. FIG. 2A shows a cross-sectional view of semiconductor device 100 at an early stage of manufacture.

In the example shown in FIG. 2A, electronic device 110 can comprise a semiconductor die. In some examples, semiconductor die 110 can comprise a semiconductor material such as, for example, silicon (Si) and can be a part of a circular semiconductor wafer 105 that includes several semiconductor die 110. Two semiconductor die 110 are shown in FIG. 2A with each die 110 having a die terminal 115 and a die terminal 117. Semiconductor die 110 can comprise passive electronic circuit elements (not shown) or active electronic circuit elements (not shown) such as transistors.

In some examples, die terminals 115 and 117 can be referred to as die pads. Die terminals 115 and 117 can comprise one or more layers or alloys of electrically conductive material such as, for example, aluminum, copper, aluminum alloy, or copper alloy. Examples for forming die terminals 115 and 117 include using an electroplating process or a physical vapor deposition (PVD) process. The thickness of die terminals 115 and 117 can range from about 0.8 micron to about 1 micron and the width of die terminals 115 and 117 can range from about 30 microns to about 100 microns. Die terminals 115 and 117 can serve as electrical contacts for providing electrical signals to the electrical circuit elements in semiconductor die 110.

In some examples, non-conductive material 114 can be referred to as a dielectric layer, an insulator, or a passivation layer. Non-conductive material 114 can comprise an electrically insulating material. Non-conductive material can comprise an inorganic material such as, for example, silicon oxide or silicon nitride. Examples for forming passivation layer 114 can comprise thermal oxidation, chemical vapor deposition (CVD), physical vapor deposition (PVD), atomic layer deposition (ALD), low pressure chemical vapor deposition (LPCVD), or plasma enhanced chemical vapor deposition (PECVD). Passivation layer 114 can be patterned using photolithography to expose a portion of die terminals 115 and 117. The thickness of passivation layer 114 can range from about 0.5 microns to about 5 microns, such as 1 micron to about 1.5 microns. The top surfaces of passivation layer 114 and terminals 115 and 117 can serve as the top surface of semiconductor die 110. In some examples, passivation layer 114 can protect die 110 from environmental exposure.

FIG. 2B shows a cross-sectional view of semiconductor device 100 at a later stage of manufacture. In the example shown in FIG. 2B, non-conductive material 127 can be formed on the exposed surfaces of passivation layer 114 and terminals 115 and 117. In some examples, non-conductive material 127 can be referred to as a buildup dielectric layer or insulator. Dielectric layer 127 can comprise an electrically insulating material, an organic material such as, for example, a polymer, polyimide (PI), benzocyclobutene (BCB), polybenzoxazole (PBO), bismaleimide triazine (BT), a molding material, a phenolic resin, an epoxy, silicone, or an acrylate polymer. Examples for forming dielectric layer 127 can comprise using spin coating, spray coating, printing, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), sheet lamination, or evaporation.

In some examples, after dielectric layer 127 is formed on the exposed surfaces of passivation layer 114 and terminals 115 and 117, then dielectric layer 127 can be patterned using photolithography to form openings, apertures, or vias 113 in dielectric layer 127. Openings 113 can expose a portion of die terminals 115 and 117. The diameter of openings 113 can range from about 10 microns to about 15 microns. The thickness of dielectric layer 127 can range from about 5 microns to about 12 microns. In some examples, dielectric layer 127 can be used to electrically isolate elements in redistribution structure 120.

FIG. 2C shows a cross-sectional view of semiconductor device 100 at a later stage of manufacture. In the example shown in FIG. 2C, conductive material 221 can be formed in openings 113 and on the exposed surfaces of dielectric layer 127 and terminals 115 and 117. In some examples, conductive material 221 can comprise one or more layers or alloys of electrically conductive material such as, for example, titanium (Ti), titanium-tungsten (TiW), copper (Cu).

Examples for forming conductive material 221 can comprise using physical vapor deposition (PVD), chemical vapor deposition (CVD), atomic layer deposition (ALD), plasma vapor deposition, electroless plating, or electrolytic plating. In some examples, PVD can be referred to as sputtering. In some examples, conductive material 221 can be comprised of two layers of electrically conductive materials. For example, conductive material 221 can be formed by forming a first electrically conductive layer comprised of titanium using a PVD process in openings 113 and on the exposed surfaces of dielectric layer 127 and terminals 115 and 117. Then, following the formation of the first electrically conductive layer comprised of titanium, a second electrically conductive layer comprised of copper can be formed using a PVD process over the exposed surface of the layer of titanium. The titanium and copper layers together can form conductive material 221. In other examples, the first electrically conductive layer of conductive material 221 can be comprised of titanium-tungsten. The thickness of conductive material 221 can range from about 0.1 microns to about 0.3 microns. In some examples, conductive material 221 can be referred to as a seed layer and can provide an electrically conductive path for electrical current for a subsequent electroplating process.

FIG. 2D shows a cross-sectional view of semiconductor device 100 at a later stage of manufacture. In the example shown in FIG. 2D, a layer comprised of photoresist 205 is formed over the exposed surface of seed layer 221. Photoresist 205 can be patterned using photolithography to form openings, apertures, or vias 213 in photoresist 205. Openings 213 can expose portions of seed layer 221. Photoresist layer 205 can be referred to as a photomask and can be used as a mask or stencil for a subsequent electroplating process.

FIG. 2E shows a cross-sectional view of semiconductor device 100 at a later stage of manufacture. In the example shown in FIG. 2E, conductive material 128 can be formed in openings 213 and on the exposed surface of seed layer 221. In some examples, conductive material 128 can comprise one or more layers or alloys of electrically conductive material such as, for example, a metal, copper (Cu), aluminum (Al), gold (Au), nickel (Ni), copper alloys, aluminum alloys, gold alloys, or nickel alloys.

An example for forming conductive material 128 can comprise using an electroplating process. In some examples, electrical current can be provided for the electroplating process using seed layer 221. The thickness of conductive material 128 can range from about 3 microns to about 15 microns.

FIG. 2F shows a cross-sectional view of semiconductor device 100 at a later stage of manufacture. In the example shown in FIG. 2F, photoresist 205 (FIG. 2E) can be removed or stripped and the portions of seed layer 221 below photoresist 205 can be removed. Examples for removing photoresist 205 can comprise using a resist strip process that can comprise a wet bath and/or a plasma clean.

Examples for removing the portions of seed layer 221 below photoresist 205 can comprise using a wet etch process that uses respective etchants for the different metallic components of seed layer 221. Conductive material 128 can serve as a mask during the etch process so that portions of seed layer 221 remain below conductive material 128. The portions of conductive material 128 and seed layer 221 coupled to die pads 115 can together be referred to as a conductive trace 238 and the portions of conductive material 128 and seed layer 221 coupled to die pads 117 can together be referred to as a conductive trace 225. Conductive traces 225 and 238 can be used to provide an electrically conductive path for providing electrical current or signals between conductive elements within or outside of semiconductor device 100. For example, conductive trace 238 can provide an electrically conductive path between semiconductor die 110 and electrical interconnect 130 (FIG. 1). For simplicity, seed layer 221 is not shown in subsequent figures.

FIG. 2G shows a cross-sectional view of semiconductor device 100 at a later stage of manufacture. In the example shown in FIG. 2G, non-conductive material 129 can be formed on the exposed surfaces of dielectric layer 127 and conductive traces 225 and 238. In some examples, non-conductive material 129 can be referred to as a buildup dielectric layer or insulator. Dielectric layer 129 can comprise an electrically insulating material. Dielectric layer 129 can comprise an organic material such as, for example, a polymer, polyimide (PI), benzocyclobutene (BCB), polybenzoxazole (PBO), bismaleimide triazine (BT), a molding material, a phenolic resin, an epoxy, silicone, or an acrylate polymer. Examples for forming dielectric layer 129 can including using spin coating, spray coating, printing, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), sheet lamination, or evaporating.

In some examples, after dielectric layer 129 is formed on the exposed surfaces of dielectric layer 127 and conductive trace 238, then dielectric layer 129 can be patterned using photolithography to form openings, apertures, or vias 223 in dielectric layer 129. Openings 223 expose portions of conductive traces 225 and 238. The diameter of openings 223 may range from about 30 microns to about 300 microns. The thickness of dielectric layer 129 can range from about 5 microns to about 12 microns. Dielectric layer 129 can be used to electrically isolate elements in redistribution structure 120. For example, dielectric layers 127 and 129 can electrically isolate conductive traces 225 and 238 from each other.

FIG. 2H shows a cross-sectional view of semiconductor device 100 at a later stage of manufacture. In the example shown in FIG. 2H, conductive material 321 can be formed in openings 223 and on the exposed surfaces of dielectric layer 129 and conductive traces 225 and 238. In some examples, conductive material 321 can comprise one or more layers or alloys of electrically conductive material such as, for example, titanium (Ti), titanium-tungsten (TiW), copper (Cu).

Examples for forming conductive material 321 can comprise using sputtering or physical vapor deposition (PVD), chemical vapor deposition (CVD), atomic layer deposition (ALD), plasma vapor deposition, electroless plating, or electrolytic plating. In some examples, conductive material 321 can be comprised of two layers of electrically conductive materials. For example, conductive material 321 can be formed by forming a first electrically conductive layer comprised of titanium using a PVD process in openings 223 and on the exposed surfaces of dielectric layer 129 and conductive traces 225 and 238. Then, following the formation of the first electrically conductive layer comprised of titanium, a second electrically conductive layer comprised of copper can be formed using a PVD process over the exposed surface of the layer of titanium. The titanium and copper layers together can form conductive material 321. In other examples, the first electrically conductive layer of conductive material 321 can be comprised of titanium-tungsten.

The thickness of conductive material 321 can range from about 0.1 microns to about 0.3 microns. In some examples, conductive material 321 can be referred to as a seed layer and can provide an electrically conductive path for electrical current for a subsequent electroplating process FIG. 2I shows a cross-sectional view of semiconductor device 100 at a later stage of manufacture. In the example shown in FIG. 2I, a layer comprised of photoresist 305 can be formed over the exposed surface of seed layer 321. Photoresist 305 can be patterned using photolithography to form openings, apertures, or vias 233 in photoresist 305. Openings 233 expose portions of seed layer 321. Photoresist layer 305 can be referred to as a photomask and can be used as a mask for a subsequent electroplating process.

FIG. 2J shows a cross-sectional view of semiconductor device 100 at a later stage of manufacture. In the example shown in FIG. 2J, conductive materials 172, 171, and 173 are formed in openings 233 on the exposed surface of seed layer 321. In some examples, conductive materials 171, 172, and 173 can comprise one or more layers or alloys of electrically conductive material such as, for example, a metal, copper, aluminum, gold, nickel, a nickel-gold alloy, a copper alloy, an aluminum alloy, a gold alloy, or a nickel alloy.

An example for forming conductive materials 171, 172, and 173 can comprise using an electroplating process. In some examples, electrical current can be provided for the electroplating process using seed layer 321. In some examples, conductive materials 171, 172, and 173 can be formed using a single electroplating operation such as, for example, plating a single layer of copper in openings 233. In other examples, conductive materials 171, 172, and 173 can formed using multiple electroplating operations. For example, conductive materials 171, 172, and 173 can be formed using a first electroplating operation to plate a layer of nickel in openings 233 followed by a second electroplating operation to plate a layer of gold on the plated layer of nickel. The thickness of each of conductive materials 171, 172, and 173 can range from about 0.5 micron to about 9 microns. For instance, the thickness of conductive materials 171, 172, 173 can range from about 8 to 9 microns for metals like copper, or from about 0.5 micron to about 2 microns for metals like nickel-gold.

FIG. 2K shows a cross-sectional view of semiconductor device 100 at a later stage of manufacture. In the example shown in FIG. 2J, photoresist 305 (FIG. 2J) can be removed or stripped and the portions of seed layer 321 below photoresist 305 can be removed. Examples for removing photoresist 305 can comprise using a resist strip process that can comprise a wet bath and/or a plasma clean.

Examples for removing the portions of seed layer 321 below photoresist 305 can comprise using a wet etch process that uses respective etchants for the different metallic components of seed layer 321. In some examples, conductive materials 171, 172, and 173 can serve as masks during the etch process so that portions of seed layer 321 remain below conductive materials 171, 172, and 173.

In some examples, conductive material 172 and the portion of seed layer 321 below conductive material 172 can together be referred to as an electrical pad or contact 272. Conductive material 171 and the portion of seed layer 321 below conductive material 171 can together be referred to as an electrical pad or contact 271. Conductive material 173 and the portion of seed layer 321 below conductive material 173 can together be referred to as an electrical pad or contact 273. In some examples, contacts 271, 272, and 273 can be used to provide electrically conductive contacts for providing electrical current or signals between conductive elements within or outside of semiconductor device 100. In some examples, contacts 271, 272, and 273 can each be referred to as an under bump metallization or under bump metallurgy (UBM) that can be used to provide a base material for forming an electrical interconnect such as, for example, a solder ball. For simplicity, seed layer 321 is not shown in subsequent figures.

Although contacts 271, 272, and 273 are described as being formed at the same time using a single photomask 305, this is not a limitation of the present disclosure. In other examples, contacts 271, 272, and 273 can be formed at different times using multiple photomasks. For example, contact 271 can be formed before contacts 272 and 273 using a first electroplating operation and a first photomask that plates a single layer of copper over seed layer 321. Then, contacts 272 and 273 can be formed at the same time using a second electroplating operation and a second photomask that plates a layer of nickel over seed layer 321 followed by plating a layer of gold over the plated layer of nickel.

FIG. 2L shows a cross-sectional view of semiconductor device 100 at a later stage of manufacture. In the example shown in FIG. 2L, electrical interconnect 130 can be formed on UBM 271. Electrical interconnect 130 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu.

Examples for forming electrical interconnect 130 include using a ball drop process, a screen-printing process, or an electroplating process. In some examples, an electrically conductive material comprising solder can be formed on UBM 271 using a solder ball drop process. A reflow process can be used to heat semiconductor device 100 to a predetermined temperature and the shape of electrical interconnect 130 can change during the reflow. Electrical interconnect 130 can be referred to as a solder ball and can provide electrical current or signals between conductive elements within or outside of semiconductor device 100.

Combined, conductive traces 238 and 225 and dielectric layers 127 and 129 can be referred to as an interconnect structure, a redistribution layer (RDL) structure, or as redistribution structure (RDS) 120. Conductive trace 238 of RDL structure 120 can be referred to as an RDL trace and can be used to move or redistribute the location for providing input/output (I/O) contact to semiconductor die 110. For example, without RDL structure 120, contact to I/O contacts such as, for example, solder ball 130 and conductive straps 140 (FIG. 1) and 180 (FIG. 1) may need to be made at the location of die pads 115 and 117. Solder ball 130 and straps 140 and 180 can be formed at locations other than the locations of die pads 115 and 117 using RDL structure 120.

Although only two conductive traces 238 and 225 are shown in RDL structure 120, this is not a limitation of the present disclosure. In other examples, more than two conductive traces can be formed over dielectric layer 129 by using the same or similar processes and materials as the processes and materials described in the present disclosure for forming conductive traces 238 and 225. Similarly, in other examples, more than two dielectric layers can be formed in RDL structure 120 over dielectric layer 129 using the same or similar process and materials as the processes and materials described in the present disclosure for forming dielectric layers 127 and 129.

Although solder ball 130 and contact 272 are shown as electrically coupled by the same conductive trace 238, this is not a limitation of the present disclosure. In some examples, contact 272 can be omitted so that only solder ball 130 is electrically coupled to conductive trace 238 without any other contacts electrically coupled to conductive trace 238.

The manufacturing processes described with respect to FIGS. 2A to 2L can be referred as a wafer level packaging process or a wafer level chip scale package (WLCSP) process. The RDL structure 120 can be formed on semiconductor wafer 105 and solder balls are formed on contacts 271 of RDL structure 120.

FIG. 2M shows a cross-sectional view of semiconductor device 100 at a later stage of manufacture. In the example shown in FIG. 2M, portions of RDL structure 120 and semiconductor die 110 are removed to form openings, apertures, or vias 413. In some examples, openings 413 are formed using a saw, a laser, or an etching process to partially cut RDL structure 120 and semiconductor die 110. In some examples, the bottom portion of die 110 is not cut and can provide a relatively rigid structure for performing subsequent manufacturing processes such as, for example, wire bonding or mold processes. In some examples, a carrier (not shown) such as a metal carrier or an adhesive can be attached to surface 211 of die 100 prior to performing the partial cut to provide a relatively rigid structure for performing the cut operation and/or to prevent warpage after the partial cut. The process used to form openings 413 can also be referred to as a partial cut or half cut operation since this operation does not cut fully through die 110.

FIG. 2N shows a cross-sectional view of semiconductor device 100 at a later stage of manufacture. In the example shown in FIG. 2N, straps 240 are formed by attaching one end of strap 240 to contact 272 and the other end of strap 240 to contact 273. In some examples, straps 240 can comprise an electrically conductive material such as, for example, copper (Cu), gold (Au), silver (Ag), aluminum (Al), or alloys of Cu, Au, Ag, or Al.

Examples for forming strap 240 can comprise using a wire bond process or a soldering process that electrically couples a wire to contacts 272 and 273. In such examples, the thickness of strap 240 can range from about 12.5 microns to about 51 microns. Strap 240 can be a wire and can be used to provide an electrically conductive path for electrical current or signals between conductive elements within or outside of semiconductor device 100 through contacts 273 and 272. Although strap 240 is described as a wire, this is not a limitation of the present disclosure. In other examples, strap 240 can be a plural wire structure, a metal lead or leadframe structure, and/or a metal plate or foil structure that is attached and electrically coupled to contacts 272 and 273 using, for example, a conductive adhesive material such as solder. In such examples, the thickness of strap 240 can range from about 125 microns to about 500 microns, including specific examples such as about 150 microns or about 200 microns.

FIG. 2O shows a cross-sectional view of semiconductor device 100 at a later stage of manufacture. In the example shown in FIG. 2O, encapsulant 150 can be formed in openings 413 (FIG. 2N) and on the exposed surfaces of die 110, RDL structure 120, and contacts 271, 272, and 273. In addition, encapsulant 150 can be formed on a portion of the exposed surface of electrical interconnects 130 so that a portion of electrical interconnect 130 is exposed and extends from protection material 150. In some examples, encapsulant 150 can comprise an electrically non-conductive material, a resin, a polymer composite material, a polymer having a filler, an epoxy resin, an epoxy resin, an epoxy acrylate having a filler such as silica or other inorganic material, a silicone resin, or a resin-impregnated B-state pre-preg film.

Examples for forming encapsulant 150 can comprise compression molding, transfer molding, liquid encapsulant molding, vacuum lamination, paste printing, or film assisted molding. Encapsulant 150 can be referred to as an encapsulant or a mold compound. Encapsulant 150 can provide protection from environmental exposure and can provide electrical isolation between elements within and outside of semiconductor device 100.

FIG. 2P shows a cross-sectional view of semiconductor device 100 at a later stage of manufacture. In the example shown in FIG. 2P, a bulk semiconductor portion of semiconductor wafer 105 is removed from bottom surface 211, leaving first and second semiconductor dies 110 side by side. In some examples, the bulk semiconductor is removed by a wafer grinding process or an etching process. In some examples, portions of encapsulant 150 can also be removed using either the same process used to remove the portions of die 110 or an additional removal process. The portion of encapsulant 150 that faces or contacts die 110 and RDL structure 120 can be referred as encapsulant interior surface.

FIG. 2Q shows a cross-sectional view of semiconductor device 100 at a later stage of manufacture. In the example shown in FIG. 2Q, a sacrificial material 170 can be formed on the top surface 153 of encapsulant 150 and over the exposed surfaces of interconnects 130. In some examples, sacrificial material 170 can comprise an electrically non-conductive material, a tape, or an adhesive film. In some examples, sacrificial material 170 can be a thermal release adhesive tape that adheres at room temperature and can be peeled off by heating the tape to a predetermined temperature.

Examples for forming sacrificial material 170 can comprise using a spin coat process or applying a tape material having an adhesive on one side of the tape to attach to top surface 153 of encapsulate 150 and the exposed surfaces of interconnects 130. Sacrificial material 170 has a surface 371 and can provide protection to interconnect 130, or provide a base structure, during subsequent manufacturing operations.

FIG. 2R shows a cross-sectional view of semiconductor device 100 at a later stage of manufacture. In the example shown in FIG. 2R, portions of sacrificial material 170, mold compound 150, and straps 240 (FIG. 2Q) are removed to create separate units that each comprise a semiconductor device 100. Examples of the removal process comprise using a saw, a laser, or an etch process to remove portions of sacrificial material 170, mold compound 150, and straps 240 (FIG. 2Q). The removal process cuts or severs straps 240 to create two separate straps or strap sections 140 and 180 in each semiconductor device 100. Inner ends of strap sections 140 and 180 remain respectively coupled to contacts 272 and 273, and outer ends of each of strap sections 140 and 180 are exposed at side surfaces or sidewalls of mold compound 150 after the removal process is completed. Strap sections 140 and 180 extend in partial-arch paths between their respective inner and outer ends. The removal process can be referred to as a singulation process. Although only two units 100 are described with respect to FIGS. 2A through 2R, this is not a limitation of the present disclosure. In some examples, more than two units 100 are formed from the manufacturing processes described with respect to FIGS. 2 through 2R.

FIG. 2S shows a top view of semiconductor device 100 at a later stage of manufacture. In the example shown in FIG. 2S, a sacrificial material 370 can be formed on a top surface of a carrier 275. In some examples, semiconductor devices 100 are attached to a top surface of sacrificial material 370 by attaching surface 371 (FIG. 2R) of tape 170 (FIG. 2R) to the top surface of sacrificial material 370. In some examples, carrier 275 can comprise metal, glass, or a semiconductor material and sacrificial material 370 can comprise an electrically non-conductive material, a tape, or an adhesive film. In some examples, sacrificial material 370 can be a thermal release adhesive tape that adheres at room temperature and can be peeled off by heating the tape to a predetermined temperature.

Examples for forming tape 370 can comprise using a spin coat process or applying a tape having an adhesive on one side of the tape to attach to surface 371 (FIG. 2R) of tape 170 (FIG. 2R). Tape 370 can provide a base structure and can assist in removing tape 170 (FIG. 2R) during a subsequent manufacturing operation.

FIG. 2T shows a cross-sectional view of semiconductor device 100 at a later stage of manufacture. The view of semiconductor device 100 in FIG. 2T is inverted relative to the views of FIGS. 2A to 2R. In the example shown in FIG. 2T, Electro-Magnetic Interference (EMI) shield 160 can be formed on the exposed surfaces of sacrificial materials 170 and 370, mold compound 150, and die 110. In some examples, EMI shield 160 can comprise one or more layers or alloys of electrically conductive material such as copper (Cu), nickel (Ni), gold (Au), silver (Ag), platinum (Pt), cobalt (Co), titanium (Ti), chrome (Cr), zirconium (Zr), molybdenum (Mo), ruthenium (Ru), hafnium (Hf), tungsten (W), rhenium (Re), or graphite. In some examples, the EMI shield 160 can comprise a binder to allow internal metal particles to be bonded to one another and to be bonded to encapsulant 150 and/or to semiconductor die 110. In other examples, EMI shield 160 can comprise a conductive polymer doped with a metal or a metal oxide, such as polyacetylene, poylaniline, polypyrrole, polythiophene or poly sulfur nitride. In other examples, EMI shield 160 can comprise a conductive ink prepared by mixing conductive materials, such as carbon black, graphite or silver.

Examples for forming EMI shield 160 can comprise using spin coating, spraying, electrolytic plating, electroless plating, or sputtering. In some examples, EMI shield 160 can be electrically coupled to straps 140 and 180 at the location where the ends of straps 140 and 180 are exposed at the sidewalls of mold compound 150. The thickness of EMI shield 160 can range from about 3 microns to about 7 microns. EMI shield 160 can be referred to as a conformal shield and can be used to provide an electromagnetic interference (EMI) shield around five sides of semiconductor device 100.

After shield 160 is formed, sacrificial materials 170 and 370 can be removed to form the structure shown in FIG. 1. In some examples, sacrificial materials 170 and 370 can each be a thermal release tape and heat can be applied to the structure shown in FIG. 2T. Then, materials 170 and 370 can be removed by pulling or peeling tape 170 and tape 370.

Turning back to FIG. 1, semiconductor device 100 can comprise a semiconductor package configured, for example, to provide interconnection for semiconductor die 110 and to provide five-sided electromagnetic (EMI) shielding to and/or from semiconductor die 110. Straps 140 and 180 can be electrically coupled to ground.

Figure 3:
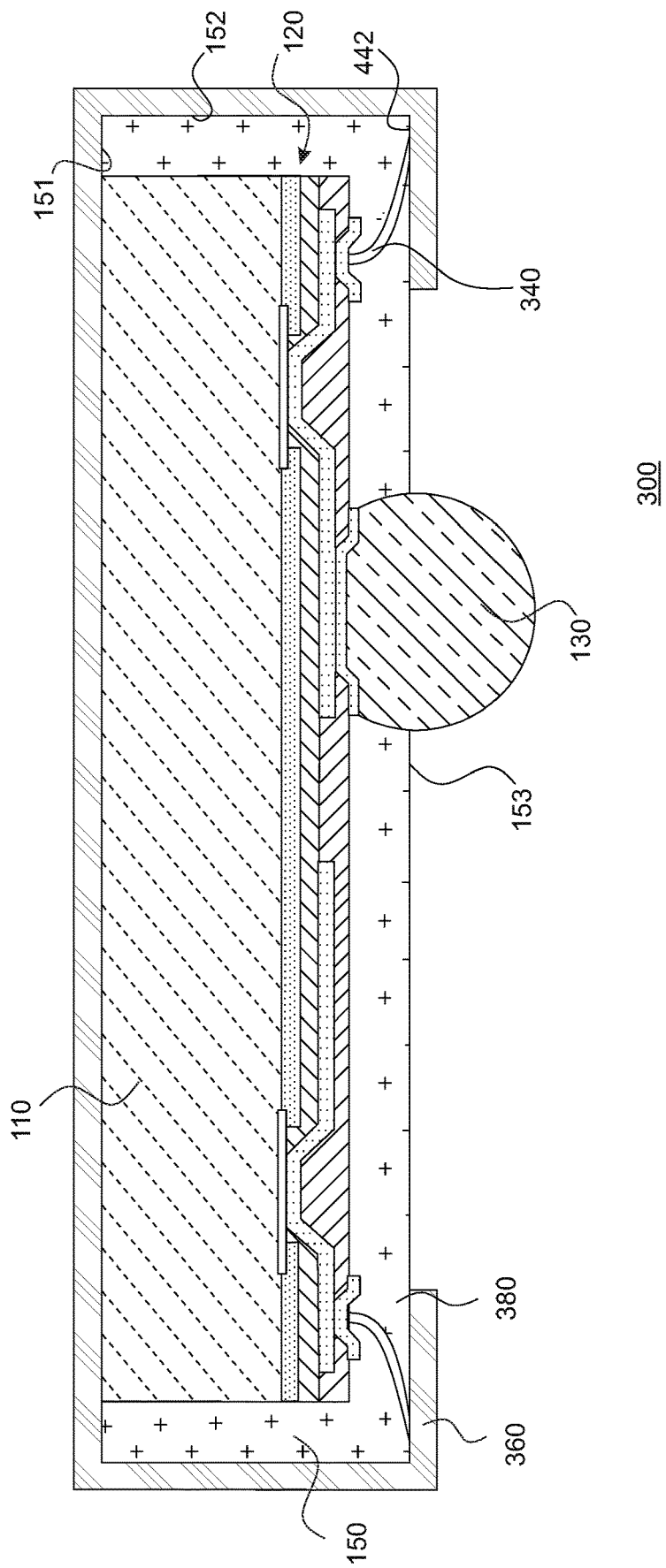
FIG. 3 shows a cross-sectional view of an example semiconductor device.

FIG. 3 shows a cross-sectional view of another example of a semiconductor device 300. Semiconductor device 300 is similar to semiconductor device 100. Semiconductor device 300 comprises shield 360 formed on portions of the bottom surface of encapsulant 150. In addition, semiconductor device 300 comprises straps 340 and 380 connected to shield 360 at the bottom surface of encapsulant 150. Semiconductor device 300 can provide EMI shielding at the bottom surface of semiconductor device 300.

Figure 4:
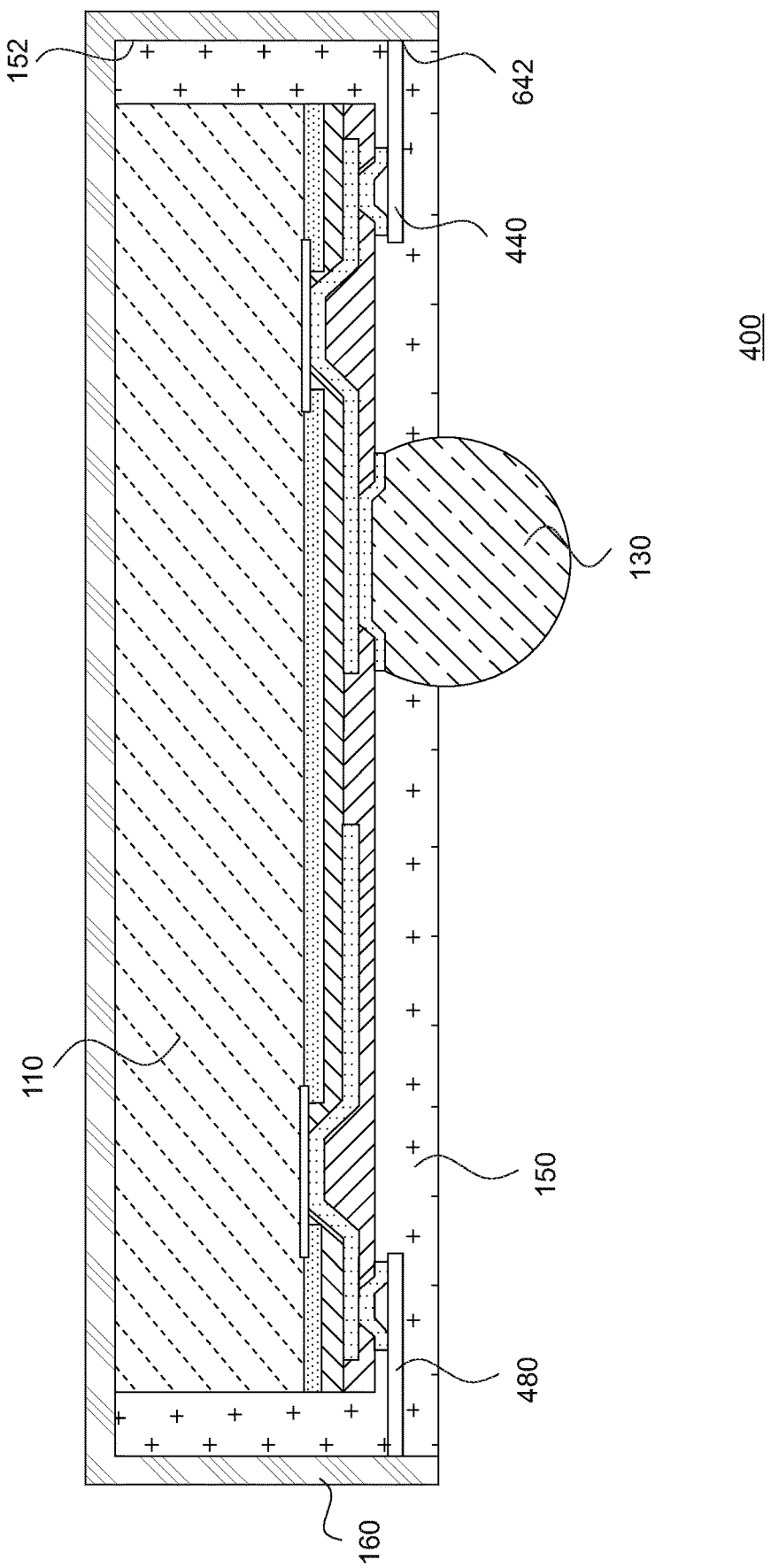
FIG. 4 shows a cross-sectional view of an example semiconductor device.

FIG. 4 shows a cross-sectional view of another example of a semiconductor device 400. Semiconductor device 400 is similar to semiconductor device 100. Semiconductor device 400 comprises conductive straps 440 and 480 electrically coupled to shield 160. In some examples, conductive straps 440 and 480 can comprise a metal plate or foil or lead or leadframe portion having one or more layers or alloys of electrically conductive materials such as gold (Au), silver (Ag), copper (Cu), aluminum (Au). The thicknesses of conductive straps 440 and 480 can range from about 125 microns to about 500 microns, including specific examples such as about 150 microns or about 200 microns.

Conductive straps 440 and 480 can be formed by placing a metal plate on contacts 272 and 273 with a conductive adhesive placed between straps 440 and 480 and contacts 272 and 278. The thickness and width of metal plates 440 and 480 can be greater than the diameter of straps 140 and 180 to permit handling of signals of relatively higher voltage and/or current.

In summary, several examples semiconductor devices with enhanced EMI shielding characteristics and related methods have been provided. The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure.

As an example, although redistribution structure 120 has been described as a buildup structure that is built layer by layer on electronic device 110 and is thus coreless, there can be other examples where redistribution structure 120 need not be a buildup structure. For instance, redistribution structure 120 can instead be a pre-fabricated structure or substrate that is attached to, rather than built on, electronic device 110. In the same or other examples, redistribution structure 120 need not be coreless and can comprise a core layer, such as a fiberglass layer, between dielectric layers 127 and 129.

As another example, although redistribution structure 120 has been presented herein having sidewalls coplanar with sidewalls of electronic device 110, there can be other examples where electronic device 110 is coupled to a center section of the top surface of redistribution structure 120, and a perimeter section of the top surface of redistribution structure 120 extends further and is exposed from electronic device 110. In such an example, encapsulant 150 can contact the exposed perimeter section of the top surface of redistribution structure 120, in addition to contacting the sidewall of electronic device 110 and the sidewall of redistribution structure 120.

As another example, although encapsulant 150 has been presented as covering the bottom surface and sidewall of redistribution structure 120 along with the sidewall of electronic device 110, there can be other examples where encapsulant 150 can cover the bottom surface of redistribution structure 120 but leave the sidewall of electronic device 110 exposed. In such examples, EMI shield 160 can contact the sidewalls of electronic device 110.

Therefore, it is intended that the present disclosure not be limited to the examples disclosed, but that the disclosure will include all examples falling within the scope of the appended claims.

The invention claimed is:

1. An electronic device comprising:
   an electronic component comprising a first component side; a second component side; and a lateral component side that extends between the first and second component sides;

a redistribution structure (RDS) comprising a first RDS side, a second RDS side, and a lateral RDS side that extends between the first and second RDS sides, wherein the second component side is coupled to the first RDS side;

an encapsulant that covers at least a portion of the second RDS side and laterally surrounds at least a portion of the electronic component;

an electromagnetic interference (EMI) shield that covers at least a portion of the first component side and laterally surrounds at least a portion of the electronic component, wherein the EMI shield comprises an inner shield surface, and wherein a bottom of the EMI shield is exposed from the encapsulant; and a conductive strap comprising a first strap end coupled to the redistribution structure, and a second strap end coupled to the inner shield surface.

2. The electronic device of claim 1, wherein the encapsulant contacts the conductive strap.

3. The electronic device of claim 1, wherein the conductive strap extends from the redistribution structure through the encapsulant to the inner shield surface.

4. The electronic device of claim 3, wherein the encapsulant comprises a horizontal encapsulant side below the second RDS side, and the second strap end is exposed from the encapsulant at the horizontal encapsulant side.

5. The electronic device of claim 1, wherein the encapsulant comprises an ablated encapsulant surface, and the second strap end is exposed from the encapsulant at the ablated encapsulant surface.

6. The electronic device of claim 5, wherein the ablated encapsulant surface comprises a laser-ablated surface.

7. The electronic device of claim 1, wherein the encapsulant laterally surrounds the redistribution structure.

8. The electronic device of claim 1, wherein
the encapsulant comprises a first encapsulant side, and a second encapsulant side that faces a same direction as the second RDS side.

9. The electronic device of claim 8, wherein:
the EMI shield covers at least a portion of the second encapsulant side; and
the second strap end is coupled to the inner shield surface at the second encapsulant side.

10. An electronic device comprising:
an electronic component comprising a first component side; a second component side; and a lateral component side that extends between the first and second component sides;
a redistribution structure (RDS) comprising a first RDS side, a second RDS side, and a lateral RDS side that extends between the first and second RDS sides, wherein the second component side is coupled to the first RDS side;
an encapsulant that covers at least a portion of the second RDS side and laterally surrounds at least a portion of the electronic component;
an electromagnetic interference (EMI) shield that covers at least a portion of the first component side and laterally surrounds at least a portion of the electronic component; and
a conductive strap comprising a first strap end coupled to the second RDS side, and a second strap end coupled to the EMI shield,
wherein a bottommost surface of the EMI shield is devoid of the second strap end.

11. The electronic device of claim 10, wherein the conductive strap comprises a wire.

12. The electronic device of claim 11, wherein:
the redistribution structure comprises a pad on the second RDS side; and
the wire is connected to the pad with a solderless connection.

13. The electronic device of claim 10, wherein the conductive strap follows a partial arch path from the second RDS side.

14. The electronic device of claim 10, wherein the first strap end comprises a first horizontal surface, the second strap end comprises a second horizontal surface, and the second strap end coupled to the EMI shield is below the first strap end coupled to the second RDS side.

15. The electronic device of claim 10, wherein the second strap end is laterally displaced relative the RDS and vertically displaced below the RDS.

16. The electronic device of claim 10, comprising an interconnect structure for connecting the electronic device to another electrical component, and wherein the redistribution structure comprises:
a first pad on the second RDS side and coupled to the first strap end; and
a second pad on the second RDS side and coupled to the interconnect structure.

17. The electronic device of claim 10, wherein the electronic component comprises a semiconductor die.

18. A method of manufacturing an electronic device, the method comprising:
providing a first structure comprising:
an electronic component comprising a first component side, a second component side, and a lateral component side that extends between the first and second component sides; and
a redistribution structure (RDS) comprising an first RDS side, a second RDS side, and a lateral RDS side that extends between the first and second RDS sides, wherein the second component side is coupled to the first RDS side;
providing a conductive strap comprising a first strap end and a second strap end, the first strap end coupled to the redistribution structure;
providing an encapsulant that covers at least a portion of the second RDS side and laterally surrounds at least a portion of the electronic component; and
providing an electromagnetic interference (EMI) shield that covers at least a portion of the first component side and laterally surrounds at least a portion of the electronic component, wherein the EMI shield comprises an inner shield surface coupled to the second strap end, and wherein a bottom of the EMI shield is exposed from the encapsulant.

19. The method of claim 18, wherein providing the encapsulant comprises forming the encapsulant to contact and surround the conductive strap.

20. The method of claim 18, comprising exposing the second strap end from the encapsulant by, at least in part, laser-ablating a portion of the encapsulant.

* * * * *